(12) United States Patent
Hassan et al.

(10) Patent No.: US 11,996,273 B2
(45) Date of Patent: May 28, 2024

(54) METHODS OF SEASONING PROCESS CHAMBERS

(71) Applicant: Applied Materials, Inc., Santa Clara, CA (US)

(72) Inventors: Vinayak Vishwanath Hassan, San Francisco, CA (US); Bhaskar Kumar, San Jose, CA (US); Anup Kumar Singh, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 783 days.

(21) Appl. No.: 17/075,801

(22) Filed: Oct. 21, 2020

(65) Prior Publication Data

US 2022/0122821 A1    Apr. 21, 2022

(51) Int. Cl.
*C23C 16/44* (2006.01)
*H01J 37/32* (2006.01)

(52) U.S. Cl.
CPC .... *H01J 37/32862* (2013.01); *C23C 16/4404* (2013.01); *C23C 16/4405* (2013.01); *H01J 37/32082* (2013.01); *H01J 37/32449* (2013.01); *H01J 37/32522* (2013.01)

(58) Field of Classification Search
None
See application file for complete search history.

(56) References Cited

U.S. PATENT DOCUMENTS

| 6,589,868 B2 | 7/2003 | Rossman |
| 7,288,284 B2 * | 10/2007 | Li ............... C23C 16/4404 |
| | | 427/249.15 |
| 2005/0214455 A1 | 9/2005 | Li et al. |

(Continued)

FOREIGN PATENT DOCUMENTS

| JP | 2002184754 A | 6/2002 | |
| KR | 10-2009-0025053 | * 3/2009 | ........... H01L 21/205 |
| WO | 2005103327 A1 | 11/2005 | |

OTHER PUBLICATIONS

Baek, Kye Hyun, et al., "Systematic procedure to optimize chamber seasoning conditions with optical emission spectroscopy in plasma etching". J. Vac. Sci. Technol. B 32, 022203 (2014), pp. 1-6.*

(Continued)

*Primary Examiner* — Bret P Chen
(74) *Attorney, Agent, or Firm* — Patterson + Sheridan, LLP

(57) ABSTRACT

Embodiments of the present disclosure relate to semiconductor processing. More specifically, embodiments of the present disclosure relate to methods for seasoning one or more components of a process chamber. In at least one embodiment, a method for seasoning a process chamber includes depositing a seasoning film onto a component of the process chamber at a chamber pressure of about 4 mTorr to about 20 mTorr and a temperature below about 200° C. or about 200° C. to about 400° C. The method includes depositing a deposition film onto the seasoning film. In at least one embodiment, a method includes introducing a nitrogen-containing gas to the seasoning film to form a nitrogen-treated seasoning film. Introducing the nitrogen-containing gas to the seasoning film is performed before depositing the deposition film onto the seasoning film.

9 Claims, 4 Drawing Sheets

(56) References Cited

U.S. PATENT DOCUMENTS

| | | | | |
|---|---|---|---|---|
| 2005/0221020 | A1* | 10/2005 | Fukiage | H01J 37/32862 |
| | | | | 257/E21.261 |
| 2006/0014397 | A1* | 1/2006 | Seamons | C23C 16/4401 |
| | | | | 257/E21.27 |
| 2008/0254233 | A1* | 10/2008 | Lee | C23C 16/26 |
| | | | | 427/595 |
| 2009/0215251 | A1* | 8/2009 | Vellaikal | H01J 37/32477 |
| | | | | 438/513 |
| 2012/0009356 | A1 | 1/2012 | Choi et al. | |
| 2013/0213434 | A1* | 8/2013 | Wang | C23C 16/402 |
| | | | | 134/1.2 |
| 2016/0358804 | A1* | 12/2016 | Kulshreshtha | H01L 21/6831 |
| 2017/0323768 | A1 | 11/2017 | Zhang et al. | |
| 2020/0146496 | A1* | 5/2020 | Patadia | A47J 36/321 |

OTHER PUBLICATIONS

International Search Report and Written Opinion dated Jan. 28, 2022 for Application No. PCT/US2021/055029.

\* cited by examiner

METHODS OF SEASONING PROCESS CHAMBERS

BACKGROUND

Field

Embodiments of the present disclosure relate to semiconductor processing. More specifically, embodiments of the present disclosure relate to methods for seasoning one or more components of a process chamber.

Description of the Related Art

Semiconductor processing involves a number of different chemical and physical processes where small integrated circuits are created on a substrate. Layers of materials which make up the integrated circuit are created by chemical vapor deposition, physical vapor deposition, epitaxial growth, chemical treatment, electrochemical process and the like.

A typical semiconductor process chamber includes a chamber body defining a process zone, a gas distribution assembly adapted to supply a gas from a gas supply into the process zone, a gas energizer, e.g., a plasma generator, utilized to energize the process gas to process a substrate positioned on a substrate support assembly, and a gas exhaust. During plasma processing, the energized gas is often comprised of ions, radicals, and/or other highly reactive species which etch and erode exposed portions of the process chamber components, for example, an electrostatic chuck that holds the substrate during processing. Additionally, processing by-products are often deposited on chamber components which must be periodically cleaned typically with highly reactive fluorine. Accordingly, in order to maintain cleanliness of the process chamber, a periodic cleaning process is performed to remove the by-products from the process chamber. Attack from the reactive species during processing and cleaning reduces the lifespan of the chamber components and increases service frequency. Additionally, flakes, such as aluminum fluoride (AlF), from the eroded parts of the chamber component may become a source of particulate contamination during substrate processing. Furthermore, AlF3 formed on a relatively high temperature component surface during cleaning process could sublimate but later deposit on a relatively low temperature chamber component surface, such as showerhead, after the cleaning process. This residual deposit can result in premature chamber component failure and frequent chamber maintenance.

Attempts have been made to protect ("season") chamber components by depositing protective materials (e.g., layers) onto one or more of the process chamber components. However, conventional seasoning methods do not work for CVD chambers that operate at low pressure (and/or low temperature). Such low pressure/low temperature CVD chambers can be advantageously used for depositing advanced patterning films onto a substrate, such as hardmask films, for example amorphous carbon hardmask films. Because of the low pressure, low temperature, and/or larger processing volume used for such chambers, conventional seasoning methods (of chamber components) provide materials (e.g., layers) that are prone to flaking and have inferior adhesion to the component(s) of the process chamber. Such flaking and inferior adhesion can promote contamination of substrates during processing.

Therefore, there is a need for improved processes for maintaining cleanliness of the process chamber and integrity of the chamber components to increase the lifetime of chamber components and provide high quality processed wafers.

SUMMARY

Embodiments of the present disclosure relate to semiconductor processing. More specifically, embodiments of the present disclosure relate to methods for seasoning one or more components of a process chamber.

In at least one embodiment, a method for seasoning a process chamber includes depositing a seasoning film onto a component of the process chamber at a chamber pressure of about 4 mTorr to about 20 mTorr and a temperature below about 200° C. or about 200° C. to about 400° C. The method includes depositing a deposition film onto the seasoning film.

In at least one embodiment, a method includes depositing the seasoning film onto the component includes flowing the first carbon-containing precursor gas and the first inert precursor gas at a first flow ratio of the first carbon-containing precursor gas and the first inert precursor gas. The method includes adjusting the first flow ratio to a second flow ratio of the first carbon-containing precursor gas and the first inert precursor gas.

In at least one embodiment, a method for seasoning a process chamber includes depositing a first seasoning film onto a component of the process chamber at a chamber pressure of about 4 mTorr to about 20 mTorr and a temperature below about 200° C. or about 200° C. to about 400° C. The method includes depositing a second seasoning film onto the first seasoning film. The method includes depositing a deposition film onto the second seasoning film. Depositing the first seasoning film includes flowing a first carbon-containing precursor gas and a first inert precursor gas into the process chamber.

In at least one embodiment, a method for seasoning a process chamber includes depositing a first seasoning film onto a component of the process chamber at a chamber pressure of about 4 mTorr to about 20 mTorr and a temperature below about 200° C. or about 200° C. to about 400° C. The method includes depositing a plurality of additional seasoning films onto the first seasoning film. The method includes depositing a deposition film onto the plurality of additional seasoning films. Depositing the first seasoning film comprises flowing a first carbon-containing precursor gas and a first inert precursor gas into the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to semiconductor processing. More specifically, embodiments of the present disclosure relate to methods for seasoning one or more components of a process chamber.

Methods of the present disclosure can provide reduced flaking of protective materials (a deposition film) and improved adhesion of the deposition film to a chamber component by providing a seasoning film disposed between the deposition film and the chamber component. For example, a deposition film can have an intrinsic stress of about 400 MPa or less (compressive), such as about 100 MPa to about 300 MPa (compressive), whereas a chamber component (e.g., an aluminum-containing component) can have an intrinsic stress of about 800 MPa or greater (compressive), such as about 900 MPa to about 1,200 MPa (compressive). Additionally or alternatively, the chamber component can have an intrinsic stress of about 100 MPa or greater (tensile), such as about 200 MPa to about 500 MPa (tensile). Such a mismatch of intrinsic stress of the deposition film and the chamber component promotes flaking and inferior adhesion of the deposition film and the chamber component. However, the inventors have discovered that by controlling the intrinsic stress of a seasoning film, a seasoning film can be tailored to beneficially adhere to the deposition film on one side of the seasoning film and adhere to the chamber component on an opposite side of the seasoning film. The inventors have discovered a number of approaches to accomplish such improvements. For purposes of the present disclosure, intrinsic stress can be determined by sticking a coupon on a chamber component, depositing the film to be measured on the coupon, removing the coupon with film deposited thereon, and analyzing the film using any suitable optical spectroscopy technique. Examples of process chambers that may be adapted to benefit from exemplary aspects of the disclosure include the PIONEER™ PECVD system commercially available from Applied Materials, Inc., located in Santa Clara, California. It is contemplated that other process chambers and/or processing platforms, including those from other manufacturers, may be adapted to benefit from aspects of the disclosure.

Figure 1:
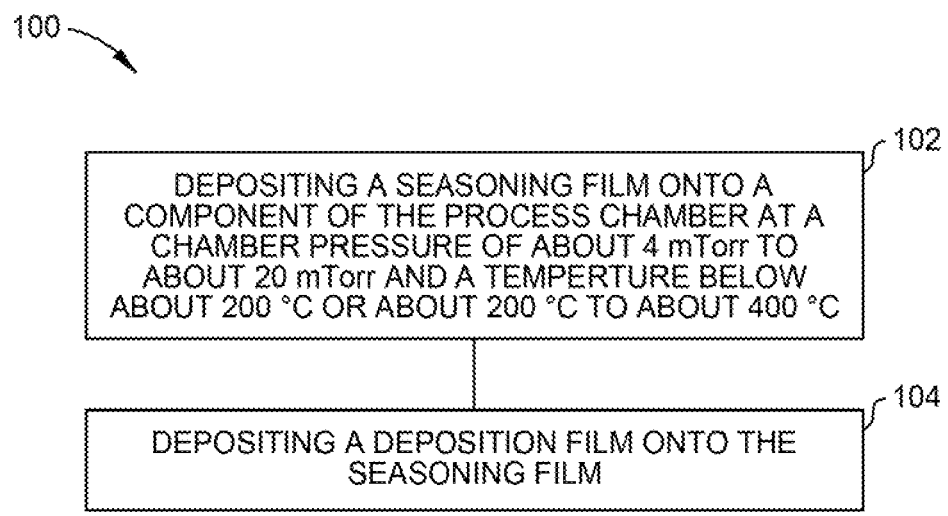
FIG. 1 is a process flow diagram of process for seasoning a process chamber, according to one aspect of the disclosure.

In some embodiments, as shown in FIG. 1, a method 100 for seasoning a process chamber (e.g., one or more components of a process chamber) includes depositing 102 a seasoning film onto a component of the process chamber at a chamber pressure of about 4 mTorr to about 20 mTorr and a temperature below about 200° C. or about 200° C. to about 400° C. The method can include depositing 104 a deposition film onto the seasoning film. In at least one embodiment, the temperature is from about 100° C. to about 200° C. Alternatively, the temperature may be about 200° C. to about 400° C., such as about 250° C. to about 350° C. A higher temperature can provide better film quality, adhesion, and/or lower intrinsic stress (as compared to processes using a lower temperature). For example, adhesion can be improved because (1) a seasoning film and a deposition film and/or (2) a seasoning film and a chamber component can to some extent diffuse with each other better (as compared to processes using a lower temperature). However, use of a higher temperature increases cost of performing a method.

Depositing the seasoning film can include flowing a first carbon-containing precursor gas and a first inert precursor gas into the process chamber. Depositing the deposition film can include flowing a second carbon-containing precursor gas and a second inert precursor gas into the process chamber. The second carbon-containing precursor gas is the same as or different than the first carbon-containing precursor gas, and the second inert precursor gas is the same as or different than the first inert precursor gas. In some embodiments, the first carbon-containing precursor gas and/or the second carbon-containing precursor gas is acetylene. In some embodiments, the first inert precursor gas and/or the second inert precursor gas is helium.

Flowing the first carbon-containing precursor gas and the first inert precursor gas into the process chamber can include flowing the first carbon-containing precursor gas into the process chamber at a flow rate of about 100 sccm to about 600 sccm, and flowing the first inert precursor gas into the process chamber at a flow rate of about 150 sccm to about 800 sccm. These flow rates are based on chambers designed to process 300 mm wafers.

The deposition film can be an amorphous carbon-containing film. In some embodiments, the deposition film has an intrinsic stress of about 400 MPa or less (compressive), such as about 100 MPa to about 300 MPa (compressive). The chamber component is a metal-containing component, such as aluminum or an aluminum alloy. The chamber component can have an intrinsic stress of about 800 MPa or greater (compressive), such as about 900 MPa to about 1,200 MPa (compressive). Additionally or alternatively, the chamber component can have an intrinsic stress of about 100 MPa or greater (tensile), such as about 200 MPa to about 500 MPa (tensile).

Depositing the deposition film onto the seasoning film is performed at a chamber pressure of about 4 mTorr to about 20 mTorr and a temperature below about 200° C. Depositing the deposition film onto the seasoning film is performed by flowing the second carbon-containing precursor gas into the process chamber at a flow rate of about 200 sccm to about 400 sccm. In some embodiments, depositing the deposition film onto the seasoning film includes providing an RF power of about 1 kW to about 6 kW to the process chamber.

Methods may further include introducing a nitrogen-containing gas to the seasoning film to form a nitrogen-treated seasoning film. Introducing the nitrogen-containing gas to the seasoning film can be performed before depositing the deposition film onto the seasoning film.

Introducing the nitrogen-containing gas to the seasoning film can be performed at a chamber pressure of about 4 mTorr to about 20 mTorr and/or a temperature below about 200° C. The nitrogen-containing gas can include any suitable nitrogen-containing gas, such as ammonia. Introducing the nitrogen-containing gas to the seasoning film can include flowing the nitrogen-containing gas into the process chamber at a flow rate of about 25 sccm to about 1,000 sccm, such as about 50 sccm to about 600 sccm. Introducing the nitrogen-containing gas to the seasoning film may include providing an RF power of about 100 kW to about 4,000 kW to the process chamber to activate the nitrogen-containing gas.

Introducing nitrogen-containing gas to a seasoning film(s) of the present disclosure can provide a nitrogen terminated surface that provides a nucleation site for the deposition film, providing improved adhesion to the deposition film and controlled bonding structure of the deposition film (e.g., low intrinsic stress of the deposition layer). Because introducing nitrogen-containing gas to a seasoning film(s) can be performed at low temperature and/or low pressure, the nitrogen treatment can occur predominantly at the surface of the seasoning film(s), promoting bonding to and nucleation of the deposition film. In addition, because the deposition film can be deposited at low temperature and/or low pressure, the deposition layer can have a low nitrogen content, reducing intrinsic stress and flaking of the deposition film.

The component of the process chamber can be any suitable component, such as a wall of the chamber, a spacer, a substrate support (such as an edge ring), and the like. In at least one embodiment, the component is not a wafer, e.g., not a semiconductor wafer. For example, processes can include placing an inert substrate on a pedestal of the chamber and performing a seasoning method. In some embodiments, a component of the process chamber is an interior wall of the process chamber. Interior walls can be larger than the walls of conventional CVD chambers, such as the walls of the Pioneer™ process chamber. Large walls are conventionally very difficult to season properly, and methods of the present disclosure can overcome such limitations.

Graded Seasoning Films

In some embodiments which may be combined with other embodiments, depositing the seasoning film onto the component includes flowing the first carbon-containing precursor gas and the first inert precursor gas at a first flow ratio of the first carbon-containing precursor gas and the first inert precursor gas. Methods include adjusting the first flow ratio to a second flow ratio of the first carbon-containing precursor gas and the first inert precursor gas. Adjusting the first flow ratio to a second flow ratio provides control of the bonding structure (e.g., $sp^2$ vs. $sp^3$ carbon-content) of surfaces of the seasoning film. For example, adjusting the first flow ratio slowly to the second flow ratio can provide a graded seasoning film with a progressive change in bonding structure from the side of the seasoning film disposed on the component to the side of the seasoning film having the deposition film disposed thereon. The hybridization of surfaces of a seasoning film can affect adhesion of a surface of the seasoning film to the chamber component and the deposition layer. Higher $sp^2$ character provides increased intrinsic stress. For example, a first flow ratio can promote high intrinsic stress (of a first surface of a seasoning film) for beneficial adhesion to a chamber component, whereas a second flow ratio can provide low intrinsic stress (of a second side of a seasoning provides reduced flaking of the deposition film and/or seasoning film, as compared to materials of conventional seasoning methods.

In some embodiments, a seasoning film is an amorphous carbon-containing film. In some embodiments, the seasoning film has an intrinsic stress of about 300 MPa to about 800 MPa (compressive). The seasoning film can progress from about 300 MPa to about 550 MPa (compressive) on a first side to about 550 MPa to about 800 MPa (compressive) on a second side. The gradient of intrinsic stress of the seasoning film provides improved adhesion and reduced flaking (as compared to conventional seasoning films of high temperature/high pressure CVD chambers).

In at least one embodiment, the first flow ratio is about 1:1 to about 1:2. In some embodiments, the second flow ratio is about 10:1 to about 1:1 or about 1:2 to about 1:10. For example, a high acetylene to helium ratio can provide higher intrinsic stress (as compared to a lower ratio). The more acetylene is diluted (e.g., 1:10 ratio) then material having lower intrinsic stress will form.

Adjusting the first flow ratio to the second flow ratio may be performed at a rate of about 1 sccm/sec to about 20 sccm/sec.

Depositing the seasoning film onto the component can include providing a first RF power to the chamber (e.g., provided from a bottom electrode of the chamber (e.g., pedestal)), and adjusting the first RF power to a second RF power. Adjusting the first RF power to a second RF power provides control of the bonding structure (e.g., $sp^2$ vs. $sp^3$ carbon-content) of surfaces of the seasoning film. For example, adjusting the first RF power slowly to the second RF power can provide a graded seasoning film with a progressive change in bonding structure from the side of the seasoning film disposed on the component to the side of the seasoning film having the deposition film disposed thereon. For example, a first RF power can promote high intrinsic stress (of a first surface of a seasoning film) for beneficial adhesion to a chamber component, whereas a second RF power can provide low intrinsic stress (of a second side of a seasoning film) for beneficial adhesion to a deposition layer. The beneficial adhesion provides reduced flaking of the deposition film and/or seasoning film, as compared to materials of conventional seasoning methods.

In some embodiments, methods include adjusting the first RF power to the second RF power at a rate of about 20 W/sec to about 500 W/sec. In at least one embodiment, the first RF power and the second RF power are independently about 1 kW to about 6 kW. For example, the first RF power may be from about 1 kW to about 4 kW and the second RF power may be from about 4 kW to about 6 kW. Low RF power provides material having high intrinsic stress, whereas high RF power provides material having low intrinsic stress.

In some embodiments, the seasoning film can have a thickness of about 100 nm to about 700 nm. The deposition film may have a thickness of about 500 nm to about 3 microns.

Methods may further include introducing a nitrogen-containing gas to the seasoning film to form a nitrogen-treated seasoning film. Introducing the nitrogen-containing gas to the seasoning film can be performed before depositing the deposition film onto the seasoning film. In some embodiments, introducing the nitrogen-containing gas to the seasoning film is performed at a chamber pressure of about 4 mTorr to about 20 mTorr and a temperature below about 200° C. The nitrogen-containing gas can include any suitable nitrogen-containing gas, such as ammonia.

Introducing the nitrogen-containing gas to the seasoning film can include flowing the nitrogen-containing gas into the process chamber at a flow rate of about 25 sccm to about 1,000 sccm, such as about 50 sccm to about 600 sccm. In some embodiments, introducing the nitrogen-containing gas to the seasoning film comprises providing an RF power of about 100 kW to about 4,000 kW to the process chamber.

Bilayer Seasoning Films

In some embodiments, a method for seasoning a process chamber includes depositing a first seasoning film onto a component of the process chamber at a chamber pressure of about 4 mTorr to about 20 mTorr and a temperature below about 200° C. or from about 200° C. to about 400° C. In some embodiments, the temperature is about 100° C. to about 200° C. Alternatively, in some embodiments, the temperature is about 200° C. to about 400° C., such as about 250° C. to about 300° C. Depositing the first seasoning film includes flowing a first carbon-containing precursor gas and a first inert precursor gas into the process chamber. The methods include depositing a second seasoning film onto the first seasoning film.

In some embodiments, a first seasoning film and/or a second seasoning film is an amorphous carbon-containing film. In some embodiments, a first seasoning film and/or a second seasoning film has an intrinsic stress of independently about 300 MPa to about 800 MPa (compressive). In some embodiments, a first seasoning film has an intrinsic stress of about 550 MPa to about 800 MPa (compressive). In at least one embodiment, a second seasoning film has an intrinsic stress of about 300 MPa to about 550 MPa (compressive).

Depositing the second seasoning film onto the first seasoning film can be performed at a chamber pressure of about 4 mTorr to about 20 mTorr and a temperature below about 200° C. Depositing the second seasoning film can include flowing a second carbon-containing precursor gas and a second inert precursor gas into the process chamber.

Methods may further include depositing a deposition film onto the second seasoning film. Depositing the deposition film can include flowing a third carbon-containing precursor gas and a third inert precursor gas into the process chamber. The second carbon-containing precursor gas is the same as or different than the first or third carbon-containing precursor gas, and the second inert precursor gas is the same as or different than the first or third inert precursor gas. Likewise, the third carbon-containing precursor gas is the same as or different than the first or second carbon-containing precursor gas and the third inert precursor gas is the same as or different than the first or second inert precursor gas. In some embodiments, the first carbon-containing precursor gas and/or the second carbon-containing precursor gas include acetylene. In some embodiments, the first inert precursor gas and/or the second inert precursor gas include helium.

Depositing the first seasoning film onto the component can include flowing the first carbon-containing precursor gas and the first inert precursor gas at a first flow ratio of the first carbon-containing precursor gas and the first inert precursor gas. Depositing the second seasoning film onto the first seasoning film can include adjusting the first flow ratio of the first carbon-containing precursor gas and the first inert precursor gas to a second flow ratio. Adjusting the first flow ratio to a second flow ratio provides control of the bonding structure (e.g., $sp^2$ vs. $sp^3$ carbon-content) of surfaces of the seasoning film. For example, adjusting the first flow ratio quickly to the second flow ratio can provide a bilayer seasoning film with a change in bonding structure from the side of the first seasoning film disposed on the component to the side of the second seasoning film having the deposition film disposed thereon. For example, a first flow ratio can promote high intrinsic stress (of a first seasoning film) for beneficial adhesion to a chamber component, whereas a second flow ratio can provide low intrinsic stress (of a second seasoning film) for beneficial adhesion to a deposition layer. The beneficial adhesion provides reduced flaking of the deposition film and/or seasoning film, as compared to materials of conventional seasoning methods.

In some embodiments, the first flow ratio is about 1:1 to about 1:2. In at least one embodiment, the second flow ratio is about 10:1 to about 1:1 or about 1:2 to about 1:10.

Adjusting the first flow ratio to the second flow ratio can performed at a rate of about 1 second or less, such as about 0.5 seconds or less.

In some embodiments, depositing the first seasoning film onto the component includes providing a first RF power to the chamber. Depositing the second seasoning film onto the first seasoning film can include adjusting the first RF power to a second RF power. Adjusting the first RF power to the second RF power may be performed at a rate of about 1 second or less, such as about 0.5 seconds or less.

Depositing the deposition film onto the second seasoning film can be performed at a chamber pressure of about 4 mTorr to about 20 mTorr and a temperature below about 200° C. Depositing the deposition film onto the second seasoning film can be performed by flowing a third carbon-containing precursor gas into the process chamber at a flow rate of about 200 sccm to about 400 sccm.

In some embodiments, the first carbon-containing precursor gas, the second carbon-containing precursor gas, and/or the third carbon-containing precursor gas include acetylene. In some embodiments, the first inert precursor gas, the second inert precursor gas, and/or the third inert precursor gas include helium. Depositing the deposition film onto the second seasoning film can include providing an RF power of about 1 kW to about 6 kW to the process chamber.

In at least one embodiment, flowing the first carbon-containing precursor gas and the first inert precursor gas into the process chamber can include flowing the first carbon-containing precursor gas into the process chamber at a flow rate of about 100 sccm to about 600 sccm, and/or flowing the first inert precursor gas into the process chamber at a flow rate of about 150 sccm to about 800 sccm. Flowing the second carbon-containing precursor gas and the second inert precursor gas into the process chamber can include flowing the second carbon-containing precursor gas into the process chamber at a flow rate of about 100 sccm to about 600 sccm. The flow rate of the second carbon-containing precursor gas can be different than the flow rate of the first carbon-containing precursor gas. Flowing the second inert precursor gas into the process chamber can be performed at a flow rate of about 150 sccm to about 800 sccm. The flow rate of the second inert precursor gas can be different than the flow rate of the first inert precursor gas.

Depositing the first seasoning film onto the component can include providing a first RF power to the chamber. Depositing the second seasoning film onto the first seasoning film can include providing a second RF power to the chamber, where the second RF power is different than the first RF power. The first RF power can be adjusted to the second RF power. Providing a second RF power different than the first RF power provides control of the bonding structure (e.g., $sp^2$ vs. $sp^3$ carbon-content) of surfaces of the seasoning film. For example, adjusting the first RF power quickly to the second RF power can provide a graded seasoning film with a change in bonding structure from the side of the seasoning film disposed on the component to the side of the seasoning film having the deposition film disposed thereon. For example, a first RF power can promote high intrinsic stress (of a first seasoning film) for beneficial adhesion to a chamber component, whereas a second RF power can provide low intrinsic stress (of a second seasoning film) for beneficial adhesion to a deposition layer. The beneficial adhesion provides reduced flaking of the deposition film and/or seasoning film, as compared to materials of conventional seasoning methods.

In some embodiments, the first RF power and the second RF power are independently about 1 kW to about 6 kW. In at least one embodiment, the first RF power is from about 1 kW to about 3 kW and the second RF power is from about 3 kW to about 6 kW.

In some embodiments, the first seasoning film and the second seasoning film can have a combined thickness of about 100 nm to about 700 nm. A thickness ratio of first seasoning film to second seasoning film can be from about 2:1 to about 1:10, such as about 1:1. The deposition film can have a thickness of about 500 nm to about 3 microns.

Methods may further include introducing a nitrogen-containing gas to the second seasoning film to form a nitrogen-treated seasoning film. Introducing the nitrogen-containing gas to the second seasoning film can be performed before depositing the deposition film onto the second seasoning film. In some embodiments, introducing the nitrogen-containing gas to the second seasoning film is performed at a chamber pressure of about 4 mTorr to about 20 mTorr and a temperature below about 200° C. The nitrogen-containing gas can include any suitable nitrogen-containing gas, such as ammonia.

Introducing the nitrogen-containing gas to the second seasoning film can include flowing the nitrogen-containing gas into the process chamber at a flow rate of about 25 sccm to about 1,000 sccm, such as about 50 sccm to about 600 sccm. In some embodiments, introducing the nitrogen-containing gas to the second seasoning film includes providing an RF power of about 100 kW to about 4,000 kW to the process chamber.

Multilayer Seasoning Films

Methods of the present disclosure can include depositing a first seasoning film onto a component of the process chamber at a chamber pressure of about 4 mTorr to about 20 mTorr and a temperature below about 200° C. or about 200° C. to about 400° C. The temperature can be from about 100° C. to about 200° C. Alternatively, the temperature can be about 200° C. to about 400° C., such as about 250° C. to about 300° C. Methods include depositing a plurality of additional seasoning films onto the first seasoning film. Methods can include depositing a deposition film onto the plurality of additional seasoning films.

In some embodiments, a first seasoning film and/or one or more films of a plurality of additional seasoning films is an amorphous carbon-containing film. In some embodiments, a first seasoning film and/or one or more films of a plurality of additional seasoning films has an intrinsic stress of independently about 300 MPa to about 800 MPa (compressive). In some embodiments, a first seasoning film has an intrinsic stress of about 550 MPa to about 800 MPa (compressive). In at least one embodiment, one or more films of a plurality of additional seasoning films has an intrinsic stress of independently about 300 MPa to about 550 MPa (compressive).

Depositing the first seasoning film can include flowing a first carbon-containing precursor gas and a first inert precursor gas into the process chamber.

A plurality of additional seasoning films may be about 3 additional seasoning films to about 14 additional seasoning films, such as about 4 additional seasoning films to about 10 additional seasoning films, such as about 4 additional seasoning films to about 8 additional seasoning films. In some embodiments, depositing the plurality of additional seasoning films includes depositing a second seasoning film onto the first seasoning film by flowing a second carbon-containing precursor gas and a second inert precursor gas into the process chamber. Depositing the plurality of additional seasoning films can include depositing a third seasoning film onto the second seasoning film by flowing a third carbon-containing precursor gas and a third inert precursor gas into the process chamber. Depositing the plurality of additional seasoning films can include depositing a fourth seasoning film onto the third seasoning film by flowing a fourth carbon-containing precursor gas and a fourth inert precursor gas into the process chamber. The second, third, and fourth carbon-containing precursor gases are independently the same as or different than each other. In some embodiments, the first carbon-containing precursor gas, the second carbon-containing precursor gas, the third carbon-containing precursor gas, and/or the fourth carbon-containing precursor gas include acetylene. The second, third, and fourth inert precursor gases are independently the same as or different than each other. In some embodiments, the first inert precursor gas, the second inert precursor gas, the third inert precursor gas, and/or the fourth inert precursor gas comprise helium.

In some embodiments, depositing the plurality of additional seasoning films includes depositing a fifth seasoning film onto the fourth seasoning film by flowing a fifth carbon-containing precursor gas and a fifth inert precursor gas into the process chamber. Methods can include depositing a sixth seasoning film onto the fifth seasoning film by flowing a sixth carbon-containing precursor gas and a sixth inert precursor gas into the process chamber. Methods can include depositing a seventh seasoning film onto the sixth seasoning film by flowing a seventh carbon-containing precursor gas and a seventh inert precursor gas into the process chamber. Methods can include depositing an eighth seasoning film onto the seventh seasoning film by flowing an eighth carbon-containing precursor gas and an eighth inert precursor gas into the process chamber. The fifth, sixth, seventh, and eighth carbon-containing precursor gases are independently the same as or different than each other. In some embodiments, the first carbon-containing precursor gas, the second carbon-containing precursor gas, the third carbon-containing precursor gas, the fourth carbon-containing precursor gas, the fifth carbon-containing precursor gas, the sixth carbon-containing precursor gas, the seventh carbon-containing precursor gas, and/or the eighth carbon-containing precursor gas include acetylene. The fifth, sixth, seventh, and eighth inert precursor gases are independently the same as or different than each other. In some embodiments, the first inert precursor gas, the second inert precursor gas, the third inert precursor gas, the fourth inert precursor gas, the fifth inert precursor gas, the sixth inert precursor gas, the seventh inert precursor gas, and/or eighth inert precursor gas include helium.

In some embodiments, depositing one or more seasoning film of the plurality of additional seasoning films is performed at a chamber pressure of about 4 mTorr to about 20 mTorr and/or a temperature below about 200° C. In at least one embodiment, depositing each seasoning film of the plurality of additional seasoning films is performed at a chamber pressure of about 4 mTorr to about 20 mTorr and a temperature below about 200° C.

In some embodiments, each seasoning film of the plurality of additional seasoning films has a different intrinsic stress than an adjacent seasoning film of the plurality of additional seasoning films. For example, a third seasoning film has a different intrinsic stress than a second seasoning film and a fourth seasoning film. Likewise, in some embodiments, a second seasoning film has a different intrinsic stress than a first seasoning film and a third seasoning film. In some embodiments, a first seasoning film has substantially the same intrinsic stress as a third seasoning film, a fifth seasoning film, and/or a seventh seasoning film. In at least one embodiment, a second seasoning film has substantially the same intrinsic stress as a fourth seasoning film, a sixth seasoning film, and/or an eighth seasoning film.

Depositing the first seasoning film onto the component can include flowing the first carbon-containing precursor gas and the first inert precursor gas at a first flow ratio of the first carbon-containing precursor gas and the first inert precursor gas. Depositing a second seasoning film onto the first seasoning film comprises adjusting the first flow ratio of the first carbon-containing precursor gas and the first inert precursor gas to a second flow ratio. Depositing a third seasoning film onto the second seasoning film can include adjusting the second flow ratio of the second carbon-containing precursor gas and the second inert precursor gas to a third flow ratio. Depositing a fourth seasoning film onto the third seasoning film can include adjusting the third flow ratio of the third carbon-containing precursor gas and the third inert precursor gas to a fourth flow ratio. In some embodiments, the first flow ratio and the third flow ratio are independently about 1:1 to about 1:2. The second flow ratio and the fourth flow ratio can be about 10:1 to about 1:1 or about 1:2 to about 1:10.

Adjusting the first flow ratio to the second flow ratio, the second flow ratio to the third flow ratio, and/or the third flow ratio to the fourth flow ratio can be performed at a rate of independently about 1 second or less, such as about 0.5 seconds or less.

Depositing a fifth seasoning film onto the fourth seasoning film can include flowing the fifth carbon-containing precursor gas and the fifth inert precursor gas at a fifth flow ratio of the fifth carbon-containing precursor gas and the fifth inert precursor gas. Depositing a sixth seasoning film onto the fifth seasoning film comprises adjusting the fifth flow ratio of the fifth carbon-containing precursor gas and the fifth inert precursor gas to a sixth flow ratio. Depositing a seventh seasoning film onto the sixth seasoning film can include adjusting the sixth flow ratio of the sixth carbon-containing precursor gas and the sixth inert precursor gas to a seventh flow ratio. Depositing an eighth seasoning film onto the seventh seasoning film can include adjusting the seventh flow ratio of the seventh carbon-containing precursor gas and the seventh inert precursor gas to an eighth flow ratio. In some embodiments, the fifth flow ratio and the seventh flow ratio are independently about 1:1 to about 1:2. The sixth flow ratio and the eighth flow ratio may be about 10:1 to about 1:1 or about 1:2 to about 1:10.

Adjusting the first flow ratio to the second flow ratio, the second flow ratio to the third flow ratio, the third flow ratio to the fourth flow ratio, the fourth flow ratio to the fifth flow ratio, the fifth flow ratio to the sixth flow ratio, the sixth flow ratio to the seventh flow ratio, and/or the seventh flow ratio to the eight flow ratio can be performed at a rate of independently about 1 second or less, such as about 0.5 seconds or less.

Adjusting the first flow ratio to a second flow ratio, the second flow ratio to a third flow ratio, the third flow ratio to a fourth flow ratio, etc. provides control of the bonding structure (e.g., sp$^2$ vs. sp$^3$ carbon-content) of surfaces of the overall seasoning film structure. For example, adjusting a flow ratio quickly to another flow ratio (e.g., alternating flow ratios 1 to 2 to 3 (e.g., same as 1) to 4 (e.g., same as 2), etc.) can provide an alternating seasoning film structure with an alternating change in bonding structure from one seasoning film to an adjacent seasoning film. The hybridization of surfaces of the seasoning films (of the overall seasoning film structure) can affect adhesion of a surface of the seasoning film structure to the chamber component and the deposition layer. Higher sp$^2$ character provides increased intrinsic stress. For example, a first flow ratio, a third flow ratio, a fifth flow ratio, and/or a seventh flow ratio can promote high intrinsic stress (of a surface of a seasoning film) for beneficial adhesion to a chamber component, whereas a second flow ratio, a fourth flow ratio, a sixth flow ratio, and/or an eighth flow ratio can provide low intrinsic stress (of the overall seasoning film structure) for beneficial adhesion to a deposition layer. The alternating deposition films provide low intrinsic stress of the overall seasoning film structure (and low intrinsic stress among the individual films due to thinness of each film), which promotes adhesion to adjacent components (such as the chamber component and the deposition film). The beneficial adhesion provides reduced flaking of the deposition film and/or seasoning film, as compared to materials of conventional seasoning methods.

Methods can include depositing the first seasoning film onto the component by providing a first RF power to the chamber. Depositing the second seasoning film onto the first seasoning film can include adjusting the first RF power to a second RF power. Depositing the third seasoning film onto the second seasoning film can include adjusting the second RF power to a third RF power. Depositing the fourth seasoning film onto the third seasoning film can include adjusting the third RF power to a fourth RF power. Adjusting the first RF power to the second RF power, the second RF power to the third RF power, and/or the third RF power to the fourth RF power can be performed at a rate of independently about 1 second or less, such as about 0.5 seconds or less. In some embodiments, the first RF power, the second RF power, the third RF power, and/or the fourth RF power are independently about 1 kW to about 6 kW. In some embodiments, the first RF power and/or third RF power are from independently about 1 kW to about 3 kW. In at least one embodiment, the second RF power and/or the fourth RF power are from independently about 3 kW to about 6 kW.

In some embodiments, depositing a fifth seasoning film onto the fourth seasoning film includes adjusting the fourth RF power to a fifth RF power. Depositing a sixth seasoning film onto the fifth seasoning film can include adjusting the fifth RF power to a sixth RF power. Depositing a seventh seasoning film onto the sixth seasoning film can include adjusting the sixth RF power to a seventh RF power. Depositing an eighth seasoning film onto the seventh seasoning film comprises adjusting the seventh RF power to an eighth RF power. Adjusting the first RF power to the second RF power, the second RF power to the third RF power, the third RF power to the fourth RF power, the fourth RF power to the fifth RF power, the fifth RF power to the sixth RF power, the sixth RF power to the seventh RF power, and/or the seventh RF power to the eighth RF power can be performed at a rate of independently about 1 second or less, such as about 0.5 seconds or less. In some embodiments, the first RF power, the second RF power, the third RF power, the fourth RF power, the fifth RF power, the sixth RF power, the seventh RF power, and/or the eighth RF power are independently about 1 kW to about 6 kW. In at least one embodiment, the first RF power, the third RF power, the fifth RF power, and/or the seventh RF power are from independently about 1 kW to about 3 kW. The second RF power, the fourth RF power, the sixth RF power, and/or the eighth RF power may be from independently about 3 kW to about 6 kW.

Adjusting the first RF power to a second RF power, the second RF power to a third RF power, the third RF power to a fourth RF power, etc. provides control of the bonding structure (e.g., sp$^2$ vs. sp$^3$ carbon-content) of surfaces of the overall seasoning film structure. For example, adjusting an RF power quickly to another RF power (e.g., alternating RF power 1 to 2 to 3 (e.g., same as 1) to 4 (e.g., same as 2), etc.) can provide an alternating seasoning film structure with an alternating change in bonding structure from one seasoning film to an adjacent seasoning film. The hybridization of surfaces of the seasoning films (of the overall seasoning film structure) can affect adhesion of a surface of the seasoning film structure to the chamber component and the deposition layer. Higher sp$^2$ character provides increased intrinsic stress. For example, a first RF power, a third RF power, a fifth RF power, and/or a seventh RF power can promote high intrinsic stress (of a surface of a seasoning film) for beneficial adhesion to a chamber component, whereas a second RF power, a fourth RF power, a sixth RF power, and/or an eighth RF power can provide low intrinsic stress (of a second side of the overall seasoning film structure) for beneficial adhesion to a deposition layer. The alternating deposition films provide low intrinsic stress of the overall seasoning film structure, which promotes adhesion to adjacent components (such as the chamber component and the deposition film). The beneficial adhesion provides reduced flaking of the deposition film and/or seasoning film, as compared to materials of conventional seasoning methods.

In some embodiments, flowing the first carbon-containing precursor gas and the first inert precursor gas into the process chamber includes flowing the first carbon-containing precursor gas into the process chamber at a flow rate of about 100 sccm to about 600 sccm, and/or flowing the first inert precursor gas into the process chamber at a flow rate of about 150 sccm to about 800 sccm.

In some embodiments, flowing the first inert precursor gas, the second carbon-containing precursor gas, the third carbon-containing precursor gas, and/or the fourth carbon-containing precursor gas into the process chamber are performed at a flow rate of independently about 100 sccm to about 600 sccm. Flowing the first inert precursor gas, the second inert precursor gas, the third inert precursor gas, and the fourth inert precursor gas into the process chamber can be performed at a flow rate of independently about 150 sccm to about 800 sccm.

In some embodiments, flowing the first inert precursor gas, the second carbon-containing precursor gas, the third carbon-containing precursor gas, the fourth carbon-containing precursor gas, the fifth carbon-containing precursor gas, the sixth carbon-containing precursor gas, the seventh carbon-containing precursor gas, and/or the eighth carbon-containing precursor gas into the process chamber are performed at a flow rate of independently about 100 sccm to about 600 sccm. Flowing the first inert precursor gas, the second inert precursor gas, the third inert precursor gas, the fourth inert precursor gas, the fifth inert precursor gas, the sixth inert precursor gas, the seventh inert precursor gas, and/or the eighth inert precursor gas into the process chamber can be performed at a flow rate of independently about 150 sccm to about 800 sccm.

The first seasoning film and the plurality of additional seasoning films have a combined thickness of about 100 nm to about 700 nm. For example, the first seasoning film can have a thickness of about 10 nm to about 100 nm. One or more films of the plurality of additional seasoning films can have a thickness of independently about 10 nm to about 100 nm. The deposition film may have a thickness of about 500 nm to about 3 microns.

In some embodiments, depositing the deposition film onto the plurality of additional seasoning films is performed at a chamber pressure of about 4 mTorr to about 20 mTorr and a temperature below about 200° C. Depositing the deposition film onto the plurality of additional seasoning films can be performed by flowing a carbon-containing precursor gas into the process chamber at a flow rate of about 200 sccm to about 400 sccm. Depositing the deposition film onto the plurality of additional seasoning films may include providing an RF power of about 1 kW to about 6 kW to the process chamber.

Methods may further include introducing a nitrogen-containing gas to one or more films of the plurality of additional seasoning films to form a nitrogen-treated seasoning film. For example, a film of the plurality may have a surface exposed to the interior chamber volume, e.g. the film is a film/the film to which the deposition film is deposited thereon. Introducing the nitrogen-containing gas to the film of the plurality of additional seasoning films can be performed before depositing the deposition film onto the film of the plurality of additional seasoning films. In some embodiments, introducing the nitrogen-containing gas to the film is performed at a chamber pressure of about 4 mTorr to about 20 mTorr and a temperature below about 200° C. The nitrogen-containing gas can include any suitable nitrogen-containing gas, such as ammonia.

Introducing the nitrogen-containing gas to the film can include flowing the nitrogen-containing gas into the process chamber at a flow rate of about 25 sccm to about 1,000 sccm, such as about 50 sccm to about 600 sccm. In some embodiments, introducing the nitrogen-containing gas to the second seasoning film includes providing an RF power of about 100 kW to about 4,000 kW to the process chamber.

Chamber Hardware

Methods of the present disclosure can be performed in a substrate process chamber utilized in substrate processing in the manufacture of electronic devices. Substrate processing includes deposition processes, etch processes, as well as other low pressure processes, plasma processes, and thermal processes used to manufacture electronic devices on substrates.

Figure 2:
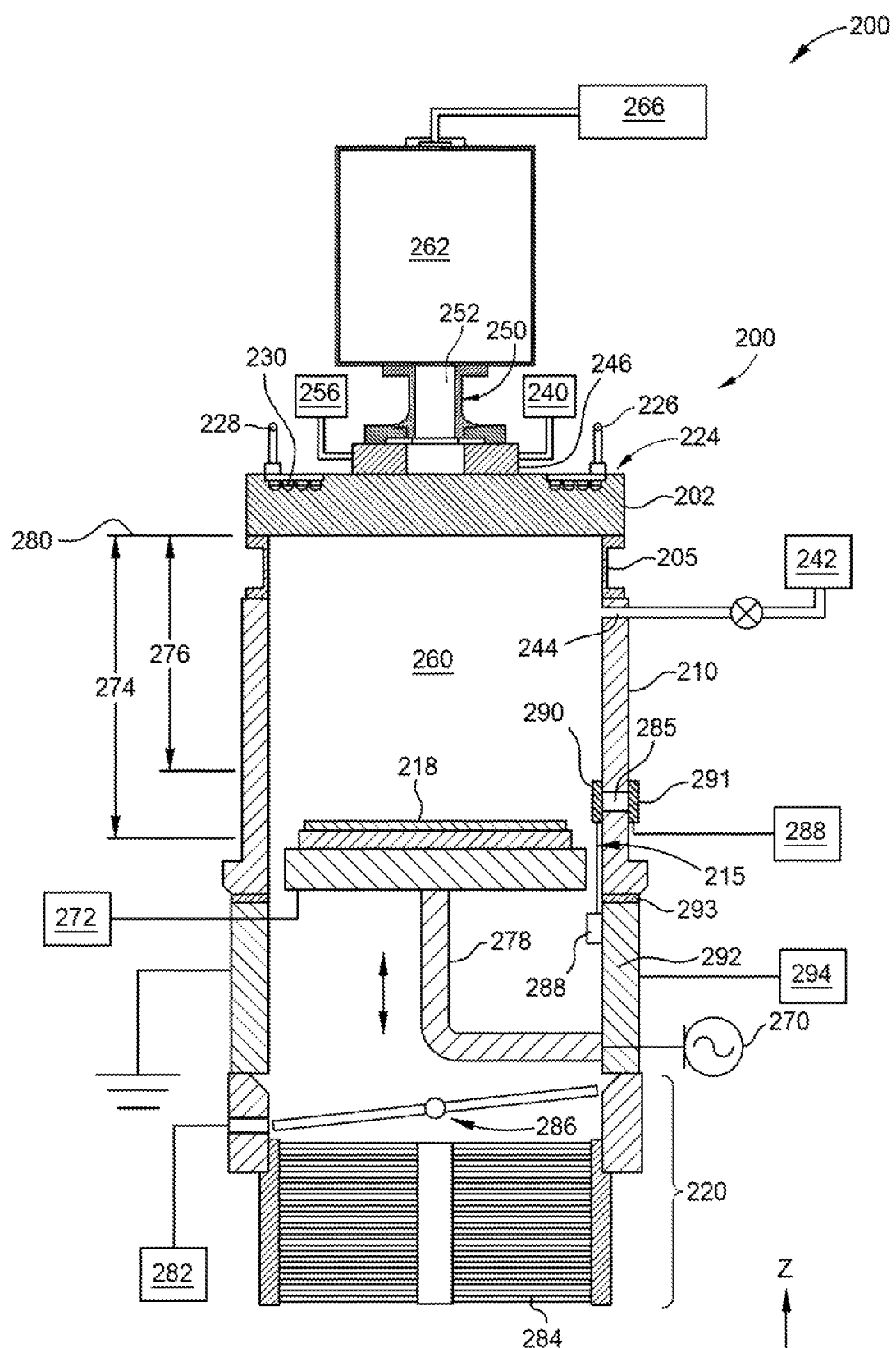
FIG. 2 is a schematic side cross sectional view of a process chamber, according to one aspect of the disclosure.

FIG. 2 is a schematic side cross sectional view of an illustrative process chamber 200 suitable for conducting a seasoning process. In one embodiment, the process chamber 200 may be configured to deposit advanced patterning films onto a substrate, such as hardmask films, for example amorphous carbon hardmask films. The process chamber 200 includes a lid 300, a spacer 210 disposed on a chamber body 292, a substrate support 215, and a variable pressure system 220. A processing volume 260 exists inside the spacer 210 between the lid 300 and the substrate support 215.

The lid 300 is coupled to a first process gas source 240. The first process gas source 240 may contain a process gas, such as precursor gas for forming films on a substrate 218 supported on the substrate support 215. As an example, the precursor gas may include carbon-containing gas. As an example, the precursor gas may include an inert gas. As an example, the precursor gas may include helium. As an example, the precursor gas may include one or more other gases. As an example, the precursor gas may include a combination of gases. In some embodiments, the precursor gas includes acetylene ($C_2H_2$).

A second process gas source 242 is fluidly coupled to the processing volume 260 via an inlet 244 disposed through the spacer 210. As an example, the second process gas source 242 may contain a process gas, such as precursor gas. As an example, the precursor gas may include carbon-containing gas. As an example, the precursor gas may include an inert gas. As an example, the precursor gas may include helium. As an example, the precursor gas may include one or more other gases. As an example, the precursor gas may include a combination of gases. In some embodiments, the precursor gas includes $C_2H_2$.

In some embodiments, for deposition on a substrate such as a wafer, a total flow rate of precursor gas into the processing volume 260 may be about 200 sccm to about 2 slm. In some embodiments, a flow rate of precursor gas into the processing volume 160 from the second processing gas source 242 may modulate a flow rate of precursor gas into the processing volume 260 from the first processing gas source 240 such that the combined precursor gas is uniformly distributed in the processing volume 260. A plurality of inlets 244 are distributed circumferentially about the spacer 210. In one example, gas flow to each of the inlets 244 may be separately controlled to further facilitate the uniform distribution of precursor gas within the processing volume 260.

The lid 300 includes a plate 302. The plate 302 is coupled to the spacer 210 via a riser 205, but it is contemplated that the riser 205 may be omitted and the plate 302 may be directly coupled to the spacer 210. In some embodiments, which may be combined with other embodiments, the riser 205 may be integrated with the plate 302. The lid 300 includes a heat exchanger 224. The heat exchanger 224 may be attached to the plate 302 or integrated with the plate 302. The heat exchanger 224 includes an inlet 226 and an outlet 228. In embodiments in which the heat exchanger 224 is integrated with the plate 302, heat exchange fluids may flow from the inlet 226, through channels 230 formed in the plate 302, and out of the outlet 228.

The plate 302 is coupled to or integrated with a manifold 246. The plate 302 is coupled to a remote plasma source 262 by a conduit 250, such as a mixing ampoule, having an axial throughbore 252 to facilitate flow of plasma through the conduit 250. Although the conduit 250 is illustrated as coupled to the manifold 246, it is contemplated that the manifold 246 may be integrated with the conduit 250 such that the conduit 250 may be directly coupled to the plate 302. The manifold 246 is coupled to the first process gas source 240 and a purge gas source 256. Both of the first process gas source 240 and the purge gas source 256 may be coupled to the manifold 246 by valves (not shown).

Although the lid 300 may be coupled to a remote plasma source 262, in some embodiments, the remote plasma source 262 may be omitted. When present, the remote plasma source 262 may be coupled to a cleaning gas source 266 via a feed line for providing cleaning gas to the processing volume 260. When the remote plasma source 262 is absent, the cleaning gas source 266 may be directly coupled to the conduit 250. When the remote plasma source 262 is absent, the cleaning gas source 266 may be indirectly coupled to the conduit 250. Cleaning gas may be provided through the conduit 250. Additionally, or alternatively, in some embodiments, cleaning gas is provided through a channel that also conveys precursor gas into the processing volume 260. As an example, the cleaning gas may include an oxygen-containing gas, such as molecular oxygen ($O_2$) and/or ozone ($O_3$). As an example, the cleaning gas may include a fluorine-containing gas, such as $NF_3$. As an example, the cleaning gas may include one or more other gases. As an example, the cleaning gas may include a combination of gases.

The substrate support 215 is coupled to a RF power source 270. The RF power source 270 may be a low frequency RF power source (for example, about 2 MHz to about 13.56 MHz). It is to be noted that other frequencies are also contemplated. In some implementations, the RF power source 270 is a mixed frequency RF power source, providing both high frequency and low frequency power. Utilization of a dual frequency RF power source, improves film deposition. In one example, utilizing a RF power source 270 provides dual frequency powers. A first frequency of about 2 MHz to about 13.56 MHz improves implantation of chemical species into the deposited film, while a second frequency of about 13.56 MHz to about 120 MHz increases ionization and deposition rate of the film.

The RF power source 270 may be utilized in creating or maintaining a plasma in the processing volume 260. For example, the RF power source 270 may be utilized during a deposition process. During a deposition or etch process, the RF power source 270 provides a power of about 100 Watts (W) to about 20,000 W in the processing volume 260 to facilitate ionization of a precursor gas. In one embodiment, which can be combined with other embodiments described herein, the RF power source 270 is pulsed. In another embodiment, which can be combined with other embodiments described herein, the precursor gas for deposition includes helium and acetylene. In one embodiment, which can be combined with other embodiments described herein, for deposition acetylene is provided at a flow rate of about 10 sccm to about 1,000 sccm and helium is provided at a flow rate of about 50 sccm to about 10,000 sccm.

The substrate support 215 is coupled to an actuator 272 (i.e., a lift actuator) that provides movement thereof in the Z direction. The substrate support 215 is also coupled to a facilities cable 278 that is flexible which allows vertical movement of the substrate support 215 while maintaining communication with the second RF power source 270 as well as other power and fluid connections. The spacer 210 is disposed on the chamber body 292. A height of the spacer 210 allows movement of the substrate support 215 vertically within the processing volume 260. Process volume 260 defines an inner diameter of the chamber. In some embodiments, an inner diameter of the chamber is about 10 inches to about 25 inches, such as about 15 inches to about 20 inches. The height of the spacer 210 may be from about 0.5 inches to about 20 inches, such as about 3 inches to about 20 inches, such as about 5 inches to about 15 inches, such as about 7 inches to about 10 inches. In one example, the substrate support 215 is movable from a first distance 274 to a second distance 276 relative to the lid 300 (for example, relative to a datum 280 of the plate 302). In one embodiment which may be combined with other embodiments, the second distance 276 is about two-thirds of the first distance 274. For example, the difference between the first distance 274 and the second distance may be about 5 inches to about 6 inches. Thus, from the position shown in FIG. 1, the substrate support 215 is movable by about 5 inches to about 6 inches relative to a datum 280 of the plate 302. In another example, the substrate support 215 is fixed at one of the first distance 274 and the second distance 276.

In contrast to conventional plasma enhanced chemical vapor deposition (PECVD) processes, the spacer 210 greatly increases the distance between (and thus the volume between) the substrate support 215 and the lid 300. The increased distance between the substrate support 215 and the lid 300 reduces collisions of ionized species in the process volume 260, resulting in deposition of film with less intrinsic stress. Films deposited with less intrinsic stress facilitate improved planarity (e.g., less bowing) of substrates upon which the film is formed. Reduced bowing of substrates results in improved precision of downstream patterning operations.

The variable pressure system 220 includes a first pump 282 and a second pump 284. The first pump 282 is a roughing pump that may be utilized during a cleaning process and/or substrate transfer process. A roughing pump is generally configured for moving higher volumetric flow rates and/or operating a relatively higher (though still sub-atmospheric) pressure. In one example, the first pump 282 maintains a pressure within the process chamber 200 less than 50 mTorr during a cleaning process. In another example, the first pump 282 maintains a pressure within the process chamber 200 of about 0.5 mTorr to about 10 Torr. Utilization of a roughing pump during cleaning operations facilitates relatively higher pressures and/or volumetric flow of cleaning gas (as compared to a deposition operation). The relatively higher pressure and/or volumetric flow during the cleaning operation improves cleaning of chamber surfaces.

The second pump 284 may be a turbo pump or a cryogenic pump. The second pump 284 is utilized during a deposition process. The second pump 284 is generally configured to operate a relatively lower volumetric flow rate and/or pressure. For example, the second pump 284 is configured to maintain the processing volume 260 of the process chamber at a pressure of less than about 50 mTorr. In another example, the second pump 284 maintains a pressure within the process chamber of about 0.5 mTorr to about 10 Torr. The reduced pressure of the processing volume 260 maintained during deposition facilitates deposition of a film having reduced neutral stress and/or increased $sp^2$-$sp^3$ conversion, when depositing carbon-based hardmasks. Thus, process chamber 200 is configured to utilize both relatively lower pressure to improve deposition or seasoning and relatively higher pressure to improve cleaning.

In some embodiments, which can be combined with other embodiments described herein, both of the first pump 282 and the second pump 284 are utilized during a deposition process to maintain the processing volume 260 of the process chamber at a pressure of less than about 50 mTorr. In other embodiments, the first pump 282 and the second pump 284 maintain the processing volume 260 at a pressure of about 0.5 mTorr to about 10 Torr. A valve 286 is utilized to control a conductance path to one or both of the first pump 282 and the second pump 284. The valve 286 also provides for symmetrical pumping from the processing volume 260.

The process chamber 200 also includes a substrate transfer port 285. The substrate transfer port 285 is selectively sealed by an interior door 290 and/or an exterior door 291. Each of the doors 290 and 291 are coupled to actuators 288 (i.e., a door actuator). The doors 290 and 291 facilitate vacuum sealing of the processing volume 260. The doors 290 and 291 also provide symmetrical RF application and/or plasma symmetry within the processing volume 260. In one example, at least the interior door 290 is formed of a material that facilitates conductance of RF power, such as stainless steel, aluminum, or alloys thereof. Seals 293, such as O-rings, disposed at the interface of the spacer 210 and the chamber body 292 further seal the processing volume 260. A controller 294 is configured to control aspects of the process chamber 200 during processing.

Controller 294 may be a processor based system controller. For example, the controller 294 may be configured to control process chamber 200 parts and processing parameters. The controller 294 may include a programmable central processing unit (CPU) that is operable with a memory and a mass storage device, an input control unit, a display unit, power supplies, clocks, cache, input/output (I/O) circuits, and the like, coupled to the various components of the process chamber 200 to facilitate control of the processes.

Figure 3A:
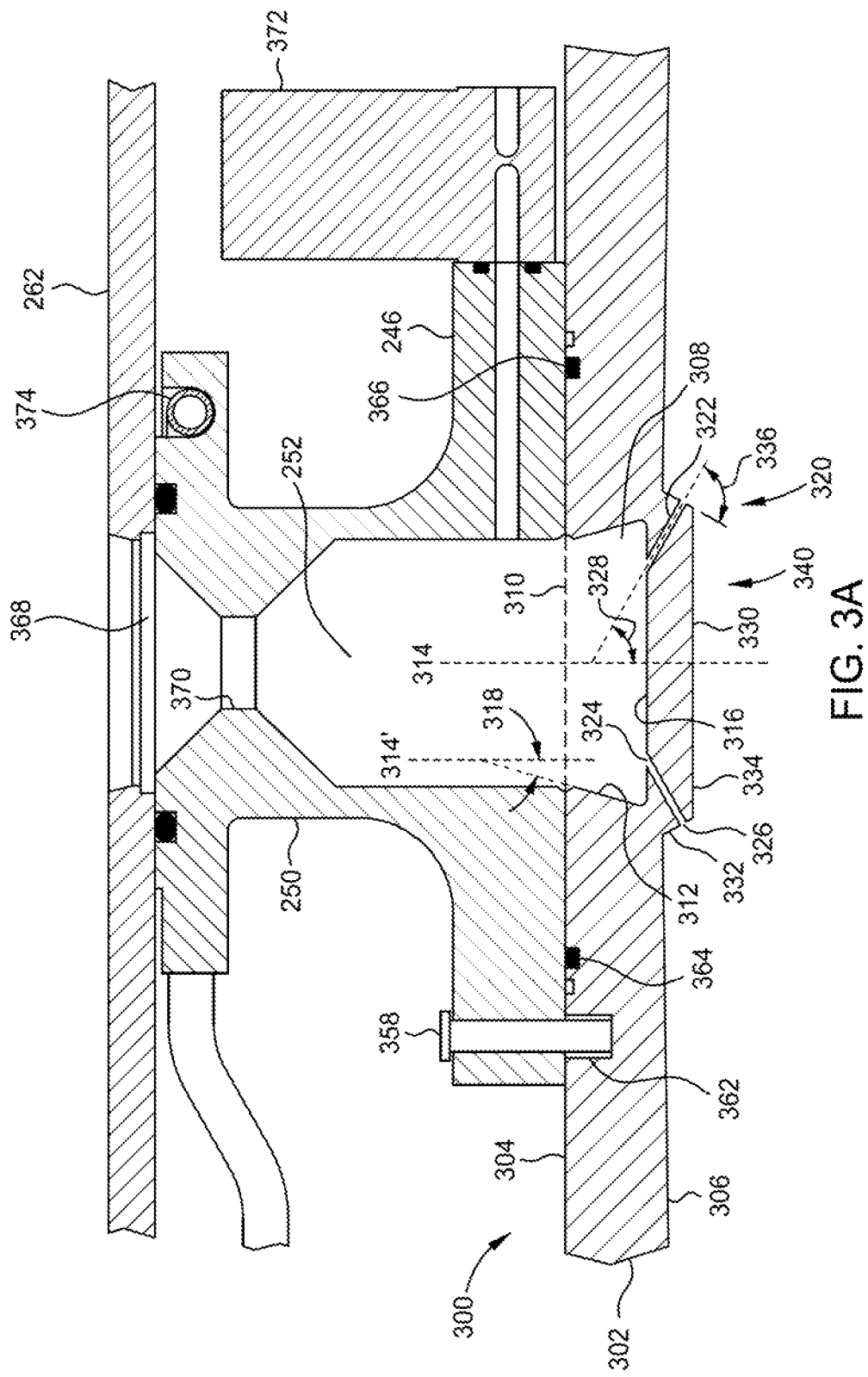
FIG. 3A is a schematic side cross sectional view of a portion of a lid coupled to a conduit, according to one aspect of the disclosure.

FIG. 3A is a cross section partial view of a lid 300 of some embodiments. As shown in FIG. 3A, the baffle 258 may be omitted. The lid 300 includes a plate 302. The plate 302 has an first surface 304 and a second surface 306 opposite the first surface 304. In some embodiments, the second surface 306 of the plate 302 may be shaped or contoured. The plate 302 may have a recess 308 in the first surface 304. The recess 308 has an opening 310 and a sidewall 312 extending from the opening 310 to a floor 316 within the plate 302. In some embodiments, the opening 310 defines a circle. For the purpose of the following geometrical description, the plate 302 may have an axis 314 that is generally perpendicular to the first surface 304 and thus extends between the first surface 304 and the second surface 306.

As shown in FIG. 3A, the sidewall 312 extends from the opening 310 to the floor 316 at an acute angle 318 to datum line 314' which is parallel to the axis 314. Thus, the sidewall 312 extends from the opening 310 to the floor 316 at an acute angle 318 to the axis 314. However, it is contemplated that the sidewall 312 may extend from the opening 310 to the floor 316 substantially parallel to the axis 314. The acute angle 318 may be between zero and 80 degrees, such as between zero and 70 degrees, such as between zero and 60 degrees, such as between zero and 50 degrees, such as between zero and 40 degrees, such as zero and 30 degrees, such as between zero and 20 degrees, such as between zero and 10 degrees. In some embodiments, as shown in FIG. 3A, the sidewall 312 may extend from the opening 310 to the floor 316 such that a cross sectional area of the opening 310 is less than a cross sectional area of the floor 316, defining a frustoconical shape.

An array 320 of holes 322 extends from the recess 308 through the plate 302 to the second surface 306. Each hole 322 extends from a corresponding entrance 324 at the recess 308 to a corresponding exit 326 at the second surface 306. Each entrance 324 is located at the floor 316 of the recess 308. However, it is contemplated that each entrance 324 may be located at the sidewall 312 of the recess 308, or that each entrance 324 may be located at an intersection of the sidewall 312 and the floor 316 of the recess 308. In some embodiments, which may be combined with other embodiments, an entrance 324 of one or more hole 322 of the array 320 of holes 322 may be located at one of the floor 316, the sidewall 312, or the intersection of the floor 316 and the sidewall 312, and an entrance 324 of one or more other hole 322 of the array 320 of holes 322 may be located at another of the floor 316, the sidewall 312, or the intersection of the floor 316 and the sidewall 312. In other words, array 320 has a plurality of holes 322 each having an entrance 324, where the entrances 324 are independently located at one of the floor 316, the sidewall 312, or the intersection of the floor 316 and the sidewall 312.

Each hole 322 has a trajectory that extends through the plate 302 at an acute angle 328 to the axis 314. The acute angle 328 is between zero and 80 degrees, such as between zero and 70 degrees, such as between zero and 60 degrees, such as between zero and 50 degrees, such as between zero and 40 degrees, such as between zero and 30 degrees, such as between zero and 20 degrees, such as between zero and 10 degrees. However, it is contemplated that at least one hole 322 may have a trajectory that is parallel to the axis 314. It is further contemplated that each hole 322 may have a trajectory that is parallel to the axis 314.

As shown in FIG. 3A, the second surface 306 includes a protrusion 330. In some embodiments, which may be combined with other embodiments, each exit 326 may be located at the protrusion 330. However other configurations are contemplated. For example, each exit 326 may not be located at the protrusion 330, or each exit 326 may be located at a base of the protrusion 330. In some embodiments, which may be combined with other embodiments, an exit 326 of one or more hole 322 of the array 320 of holes 322 may be located at one of the protrusion 330, the base of the protrusion 330, or a portion of the second surface 306 away from the protrusion 330, and an exit 326 of one or more other hole 322 of the array 320 of holes 322 may be located at another of the protrusion 330, the base of the protrusion 330, or a portion of the second surface 306 away from the protrusion 330. In other words, the array 320 has a plurality of holes 322 each having an exit 326, where each exit 326 is independently located at the protrusion 330, the base of the protrusion 330, or a portion of the second surface 306 away from the protrusion 330.

The protrusion 330 is frustoconical in shape having a side face 332 and an end face 334, but other configurations are contemplated. In some embodiments, the protrusion 330 may be shaped like a portion of a sphere, an ellipsoid, or a cylinder. In some embodiments, which may be combined with other embodiments, each exit 326 may be located at the side face 332, or each exit 326 may be located at the end face 334, or, each exit 326 may be located at an intersection of the side face 332 and the end face 334. In some embodiments, which may be combined with other embodiments, an exit 326 of one or more hole 322 of the array 320 of holes 322 may be located at one of the side face 332, the end face 334, or the intersection of the side face 332 and the end face 334, and an exit 326 of one or more other hole 322 of the array 320 of holes 322 may be located at another of the side face 332, the end face 334, and the intersection of the side face 332 and the end face 334. In other words, array 320 has a plurality of holes 322 each having an exit 326 that is independently located at one of the side face 332, the end face 334, or the intersection of the side face 332 and the end face 334. In some embodiments, which may be combined with other embodiments, an angle 336 at which the trajectory of each hole 322 whose exit 326 is located at the side face 332 intersects the side face 332 may be substantially 90 degrees.

The plate 302 includes a centrally located showerhead 340, which includes the protrusion 330 (when present) and the array 320 of holes 322. As shown in FIG. 3A, the showerhead 340 is integral with the plate 302. However, it is contemplated that the showerhead 340 may be permanently attached to the plate 302 or removably attached to the plate 302. The arrangement of the showerhead 340 and the plate 302, particularly in embodiments in which the showerhead 340 is integral with the plate 302, may facilitate the entire enclosure of processing volume 260 (including plate 302, riser 205 (when present), and spacer 210) being fully grounded during use, thereby inhibiting the generation of parasitic plasma.

The array 320 of holes 322 may be arranged as a single ring of holes 322 or into multiple rings of holes 322. The holes 322 of the array 320 of holes 322 can be arranged at a substantially uniform spacing in a ring. The holes 322 of the array 320 of holes 322 can be arranged at a non-uniform spacing in a ring. When utilizing the multiple rings of holes 322, the multiple rings of holes 322 may be concentric, non-concentric, or arranged as clusters. In some embodiments, which may be combined with other embodiments, some rings of the multiple rings of holes 322 may be arranged as one of concentric, non-concentric, and clustered, and other rings of the multiple rings of holes 322 may be arranged as another of concentric, non-concentric, and clustered.

Other arrangements of the holes 322 are also contemplated. For example, at least some of the holes 322 of the array 320 of holes 322 may be arranged into other geometric patterns, such as a line, a triangle, a quadrilateral, a pentagon, a hexagon, and the like. Additionally, or alternatively, at least some holes 322 of the array 320 of holes 322 may be arranged as a cluster of holes 322 defining a regular pattern, such as a pattern displaying one or more uniform spacing dimension between pairs of adjacent holes 322. Additionally, or alternatively, at least some holes 322 of the array 320 of holes 322 may be arranged as a cluster of holes 322 defining an irregular pattern, such as a pattern displaying non-uniform spacing dimensions between pairs of adjacent holes 322.

Figure 3B:
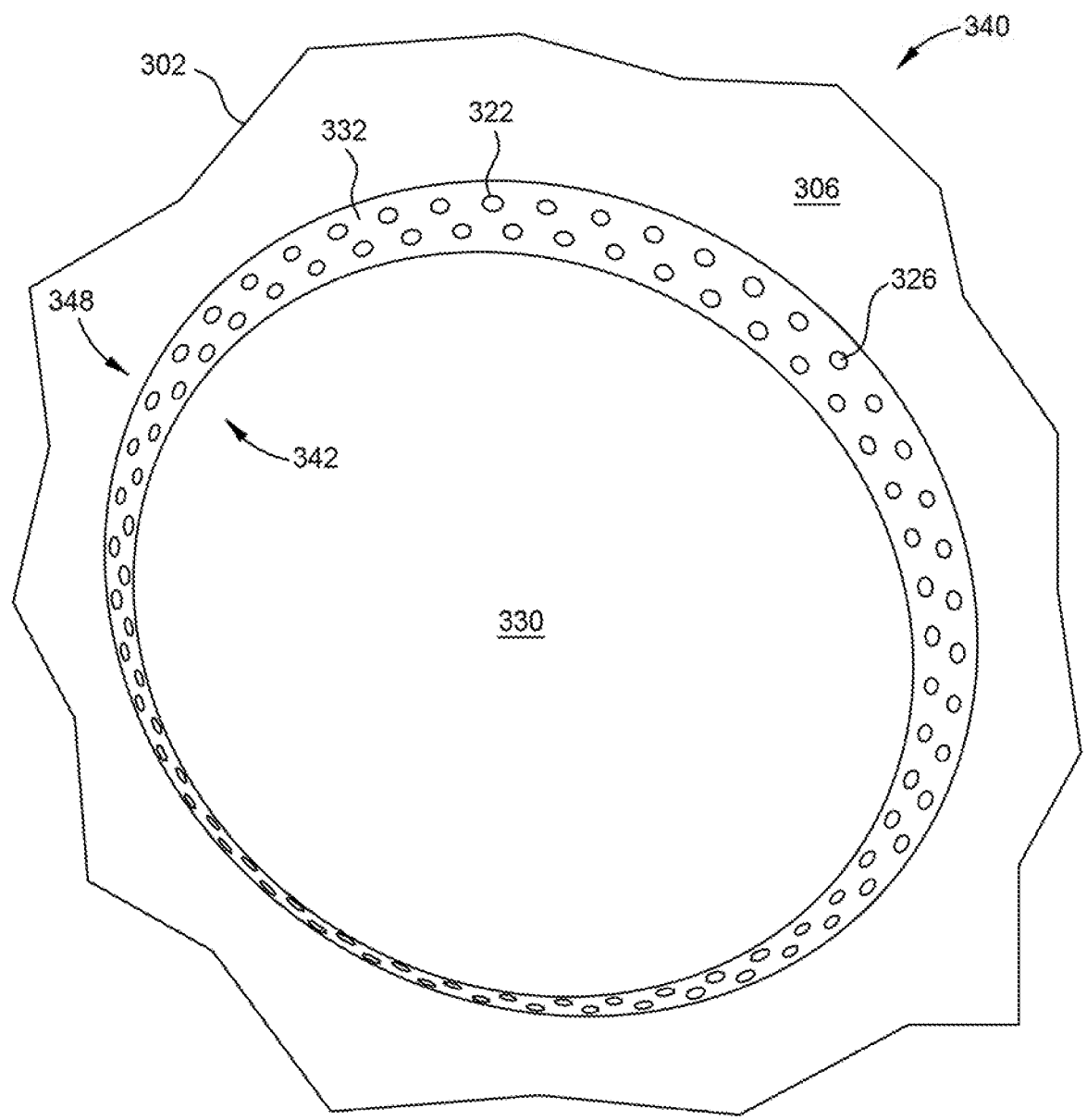
FIG. 3B is a perspective view of a showerhead of the lid of FIG. 2A.

As shown in FIG. 3B, the array 320 of holes 322 is arranged as two rings of holes 322, a first ring 342 and a second ring 348. In some embodiments, which may be combined with other embodiments, the angle 328 of the trajectory of each hole 322 of the array 320 of holes 322 may be substantially the same, for example, within 1 degree of one another. However, it is contemplated, the angle 328 of the trajectory of some holes 322 of the array 320 of holes 322 may differ from the angle 328 of the trajectory of other holes 322 of the array 320 of holes 322.

A diameter of each hole 322 of the array 320 of holes 322 may be substantially the same as the diameter of each other hole 322, as determined by standard manufacturing tolerances. However, it is contemplated that the diameter of some holes 322 of the array 320 of holes 322 may differ from the diameter of other holes 322 of the array 320 of holes 322. For example, holes 322 having a first diameter may be arranged into a first cluster or geometric shape or pattern, and holes 322 having a second diameter different from the first diameter may be arranged into a second cluster or geometric shape or pattern. In such examples, the first cluster or geometric shape or pattern may have a size, shape, and/or pattern similar to a size, shape, and/or pattern of the second cluster or geometric shape or pattern. Additionally, or alternatively, the first cluster or geometric shape or pattern may have a size, shape, and/or pattern different from a size, shape, and/or pattern of the second cluster or geometric shape or pattern.

In some embodiments, which may be combined with other embodiments, the diameter of each hole 322 of the array 320 of holes 322 may be substantially uniform. In some embodiments, the diameter of each hole 322 of the array 320 of holes 322 may be substantially non-uniform. For example, the diameter of each hole 322 may taper from a larger diameter at each entrance 324 to a smaller diameter at each exit 326. Alternatively, the diameter of each hole 322 may taper from a smaller diameter at each entrance 324 to a larger diameter at each exit 326. Alternatively, the diameter of each hole 322 may be uniform along part of the length of each hole 322, and may transition to a different diameter such that the diameter of each hole 322 at the entrance 324 may be greater than or less than the diameter of each hole 322 at the exit 326. In some embodiments, which may be combined with other embodiments, the diameter of some holes 322 of the array 320 of holes 322 may be substantially uniform, and the diameter of other holes 322 of the array 320 of holes 322 may be substantially non-uniform.

The sizing of each hole 322 of the array 320 of holes 322 may be selected by determining any one or more of a hole 322 length, a hole 322 diameter, a variation of hole 322 diameter along the hole 322 length, or a trajectory of each hole 322. In some embodiments, which may be combined with other embodiments, the number and/or sizing of the holes 322 of the array 320 of holes 322 may be selected according to one or more predetermined operational parameters or constraints. For example, the number and/or sizing of the holes 322 of the array 320 of holes 322 may be selected according to one or more ranges of values of one or more predetermined operational parameters or constraints. Example operational parameters and constraints may include, without limitation, any one or more of a sheath thickness of plasma created during operation, a pressure of gas at the entrance 324 of each hole 322, a pressure of gas at the exit 326 of each hole 322, an average velocity of gas through each hole 322, a velocity of gas within each hole 322 at the entrance 324 of each hole 322, a velocity of gas within each hole 322 at the exit 326 of each hole 322, a total volumetric flow rate of gas through the holes 322, a total volumetric flow rate of gas through a group of holes 322 of the array 320 of holes 322, and the like.

The number of holes 322 and/or sizing of the holes 322 of the array 320 of holes 322 may be selected according to a pressure of gas at the entrance 324 of each hole 322 being about 0.01 Torr to about 10 Torr, such as about 0.01 Torr to about 5 Torr, such as about 0.01 Torr to about 3 Torr, such as about 0.1 Torr to about 3 Torr, such as about 1 Torr to about 3 Torr.

The number of holes 322 and/or sizing of the holes 322 of the array 320 of holes 322 may be selected according to a pressure of gas at the exit 326 of each hole 322 being about 1 mTorr to about 1 Torr, such as about 1 mTorr to about 0.5 Torr, such as about 1 mTorr to about 0.1 Torr, such as about 1 mTorr to about 50 mTorr, such as about 1 mTorr to about 20 mTorr.

It is further contemplated that the number of holes 322 of the array 320 of holes 322 may be selected according to one or more predetermined operational parameters or constraints, and the sizing of the holes 322 may be selected according to one or more other predetermined operational parameters or constraints. For example, a diameter of each hole 322 may be selected according to any one or more of a sheath thickness of plasma created during operation, a pressure of gas at the entrance 324 of each hole 322, a pressure of gas at the exit 326 of each hole 322, an average velocity of gas through each hole 322, a velocity of gas within each hole 322 at the entrance 324 of each hole 322, a velocity of gas within each hole 322 at the exit 326 of each hole 322, and the like; and the number of holes 322 of the array 320 of holes 322 may be selected according to another of any one or more of a pressure of gas at the entrance 324 of each hole 322, a pressure of gas at the exit 326 of each hole 322, an average velocity of gas through each hole 322, a velocity of gas within each hole 322 at the entrance 324 of each hole 322, a velocity of gas within each hole 322 at the exit 326 of each hole 322, a total volumetric flow rate of gas through the holes 322, a total volumetric flow rate of gas through a group of holes 322 of the array 320 of holes 322, and the like.

In some embodiments, which may be combined with other embodiments, each hole 322 of the array 320 of holes 322 may be sized to have a diameter no greater than five times a sheath thickness of plasma created during operation, such as no greater than four times a sheath thickness of plasma created during operation, such as no greater than three times a sheath thickness of plasma created during operation, such as no greater than two times a sheath thickness of plasma created during operation, such as no greater than a sheath thickness of plasma created during operation.

It is further contemplated that the number and/or diameter of holes 322 of the array 320 of holes 322 may be selected such that a velocity of gas within each hole 322 at the exit 326 of each hole 322 is less than Mach 1 but greater than or equal to a half of Mach 1. It is further contemplated that the number and/or diameter of holes 322 of the array 320 of holes 322 may be selected such that a velocity of gas within each hole 322 at the exit 326 of each hole 322 is substantially equal to Mach 1. It is further contemplated that the number and/or diameter of holes 322 of the array 320 of holes 322 may be selected such that a velocity of gas within each hole 322 at the exit 326 of each hole 322 is greater than Mach 1 but no greater than Mach 2.

It is further contemplated that the number and/or diameter of holes 322 of the array 320 of holes 322 may be selected such that a velocity of gas within each hole 322 at the entrance 324 of each hole 322 is less than Mach 1. It is further contemplated that the number and/or diameter of holes 322 of the array 320 of holes 322 may be selected such that a velocity of gas within each hole 322 at the entrance 324 of each hole 322 is substantially equal to Mach 1. It is further contemplated that the number and/or diameter of holes 322 of the array 320 of holes 322 may be selected such that a velocity of gas within each hole 322 at the entrance 324 of each hole 322 is greater than Mach 1 but no greater than Mach 2.

As shown in FIG. 3A, part of an assembly includes plate 302 of lid 300. A conduit 250 is attached to the first surface 304 of plate 302. The conduit 250 has a throughbore 252 that is substantially aligned with the recess 308. The conduit 250 is attached to the first surface 304 of the plate 302 by one or more fasteners 358. As illustrated, the first surface 304 of the plate 302 includes one or more openings 362 for receiving corresponding fasteners 358, such as bolts, screws, studs, dowel pins, or the like. Additionally, or alternatively, it is contemplated that the first surface 304 may include one or more projections for connecting the plate 302 to the conduit 250, and the projections may be threaded. A seal groove 364 in the first surface 304 of the plate 302 is located between the one or more fasteners 358 and the recess 308, and surrounds the opening 310 to the recess 308. It is contemplated that where multiple fasteners 358 are utilized, the fasteners 358 surround the seal groove 364. As shown in FIG. 3A, a seal member 366, such as an O-ring, is installed in the seal groove 364, thereby sealing an interface between the plate 302 and the conduit 250. It is contemplated that the seal member 366 may contact a portion of the conduit 250 or a flange or other structure associated with the conduit 250, such as manifold 246.

The conduit 250 is shown coupled to a remote plasma source 262, part of which is shown in FIG. 3A. The throughbore 252 may be substantially aligned with an outlet 368 of the remote plasma source 262. It is contemplated that the throughbore 252 may have a substantially uniform inner diameter along a length of the conduit 250 from the outlet 368 of the remote plasma source 262 to the first surface 304 of the plate 302, however, as shown in the example of FIG. 3A, the throughbore 252 may include a restriction 370 part-way along the length of the conduit 250 from the outlet 368 of the remote plasma source 262 to the first surface 304 of the plate 302.

As shown in FIG. 3A, the conduit 250 incorporates a manifold 246. The manifold 246 is coupled to the first process gas source 240 via a valve 372. In some embodiments, the manifold 246 may provide a single point of entry of process gas into the conduit 250, however it is contemplated that the manifold 246 may provide multiple points of entry of process gas into the conduit 250. In some embodiments, the manifold 246 may be coupled to the purge gas source 256, however it is contemplated that the conduit 250 may be coupled to the purge gas source 256 at a location of the conduit 250 other than at the manifold 246. For example, the conduit 250 may be coupled to the purge gas source 256 at a location at or near an upper end of the conduit 250. As shown in FIG. 3A, the conduit 250 includes a heat exchanger 374, such as a tube configured to convey heat exchange fluid. It is contemplated, however, that the heat exchanger 374 may be omitted.

In operation, purge gas (inert gas(es)) from the purge gas source 256 enters the conduit 250 and becomes mixed with gas from the first process gas source 240. The combined gases flow out of the conduit 250 and through the holes 322 in the plate 302 into the processing volume 260. A cleaning cycle of operation involves cleaning gas flowing through the conduit 250 and through the holes 322 in the plate 302 into the processing volume 260. It is contemplated that the cleaning gas may become mixed with the purge gas in the conduit 250 before the combined gases flow through the holes 322 in the plate 302 into the processing volume 260. It is further contemplated that plasma from the remote plasma source 262 enters the conduit 250 and becomes mixed with the purge gas in the conduit 250 before the combined plasma and gas flow through the holes 322 in the plate 302 into the processing volume 260.

The embodiments of the present disclosure provide a number of benefits for the operation of the process chamber 200, such as the reduction or elimination of certain undesirable effects. An example undesirable effect concerns the plate 302 providing a path for the RF applied to the process chamber 200 to traverse through components that are upstream of the lid 300. For example, the RF may traverse through the conduit 250, the remote plasma source 262, and into a feed line leading to the remote plasma source 262 from the source 266 of the cleaning gas. This may lead to the establishment of a standing wave plasma, and thereby may cause deposition within the conduit 250, the remote plasma source 262, and the feed line.

Another undesirable effect mitigated by the embodiments of the present disclosure concerns the low operation pressure of the processing volume 260 and low gas velocities giving rise to back diffusion of radicals into the conduit 250, the remote plasma source 262, and the feed line. Such back diffusion of radicals may cause or contribute to deposition within the conduit 250, the remote plasma source 262, and the feed line.

Further still, the above undesirable effects may impact operation of the process chamber 200 to the extent of causing stray depositions inside the processing volume 260, such as on the lid 300, the spacer 210, and/or even on the substrate 218 and on films deposited on the substrate 218. Such stray depositions may result in defects in a substrate 218 and in films deposited on the substrate 218.

The arrangement of the showerhead 340 and the plate 302, particularly in embodiments in which the showerhead 340 is integral with the plate 302, may facilitate the entire enclosure of processing volume 260 (including plate 302, riser 205 (when present), and spacer 210) being fully grounded during use, thereby inhibiting the generation of parasitic plasma. Thus, the embodiments of the present disclosure may inhibit unwanted RF traversal upstream, thereby hindering the creation of standing wave plasma and deterring parasitic deposition.

Additionally, the embodiments of the present disclosure may promote a velocity of the gas entering the processing volume 260 through the lid 300 to be of a magnitude sufficient to inhibit back diffusion of radicals. Thus, the embodiments of the present disclosure may deter upstream stray depositions. Furthermore, the velocity of the gas entering the processing volume 260 through the lid 300 may be of a magnitude sufficient to inhibit stray deposition within the processing volume 260, thereby reducing the incidence and magnitude of defects in a substrate 218 and in films deposited on the substrate 218.

Additional Aspects

The present disclosure provides, among others, the following aspects, each of which may be considered as optionally including any alternate aspects.

Clause 1. A method for seasoning a process chamber, comprising:
depositing a seasoning film onto a component of the process chamber at a chamber pressure of about 4 mTorr to about 20 mTorr and a temperature below about 200° C. or about 200° C. to about 400° C.; and
depositing a deposition film onto the seasoning film.

Clause 2. The method of Clause 1, wherein the temperature is from about 100° C. to about 200° C.

Clause 3. The method of Clauses 1 or 2, wherein the temperature is about 250° C. to about 300° C.

Clause 4. The method of any of Clauses 1 to 3, wherein:
depositing the seasoning film comprises flowing a first carbon-containing precursor gas and a first inert precursor gas into the process chamber; and
depositing the deposition film comprises flowing a second carbon-containing precursor gas and a second inert precursor gas into the process chamber, wherein the second carbon-containing precursor gas is the same as or different than the first carbon-containing precursor gas and the second inert precursor gas is the same as or different than the first inert precursor gas.

Clause 5. The method of any of Clauses 1 to 4, wherein depositing the deposition film onto the seasoning film is performed at a chamber pressure of about 4 mTorr to about 20 mTorr and a temperature below about 200° C.

Clause 6. The method of any of Clauses 1 to 5, wherein depositing the deposition film onto the seasoning film is performed by flowing the second carbon-containing precursor gas into the process chamber at a flow rate of about 200 sccm to about 400 sccm.

Clause 7. The method of any of Clauses 1 to 6, wherein depositing the deposition film onto the seasoning film comprises providing an RF power of about 1 kW to about 6 kW to the process chamber.

Clause 8. The method of any of Clauses 1 to 7, wherein the first carbon-containing precursor gas and the second carbon-containing precursor gas comprise acetylene.

Clause 9. The method of any of Clauses 1 to 8, wherein the first inert precursor gas and the second inert precursor gas comprise helium.

Clause 10. The method of any of Clauses 1 to 9, wherein flowing the first carbon-containing precursor gas and the first inert precursor gas into the process chamber comprises:
flowing the first carbon-containing precursor gas into the process chamber at a flow rate of about 100 sccm to about 600 sccm, and
flowing the first inert precursor gas into the process chamber at a flow rate of about 150 sccm to about 800 sccm.

Clause 11. The method of any of Clauses 1 to 10, wherein depositing the seasoning film onto the component comprises:
flowing the first carbon-containing precursor gas and the first inert precursor gas at a first flow ratio of the first carbon-containing precursor gas and the first inert precursor gas; and
adjusting the first flow ratio to a second flow ratio of the first carbon-containing precursor gas and the first inert precursor gas.

Clause 12. The method of any of Clauses 1 to 11, wherein the first flow ratio is about 1:1 to about 1:2.

Clause 13. The method of any of Clauses 1 to 12, wherein the second flow ratio is about 10:1 to about 1:1 or about 1:2 to about 1:10.

Clause 14. The method of any of Clauses 1 to 13, wherein adjusting the first flow ratio to the second flow ratio is performed at a rate of about 1 sccm/sec to about 20 sccm/sec.

Clause 15. The method of any of Clauses 1 to 14, wherein depositing the seasoning film onto the component comprises:
   providing a first RF power to the chamber, and
   adjusting the first RF power to a second RF power.

Clause 16. The method of any of Clauses 1 to 15, wherein adjusting the first RF power to the second RF power is performed at a rate of about 20 W/sec to about 500 W/sec.

Clause 17. The method of any of Clauses 1 to 16, wherein the first RF power and the second RF power are independently about 1 kW to about 6 kW.

Clause 18. The method of any of Clauses 1 to 17, wherein the first RF power is from about 1 kW to about 4 kW and the second RF power is from about 4 kW to about 6 kW.

Clause 19. The method of any of Clauses 1 to 18, wherein depositing the seasoning film onto the component comprises:
   providing a first RF power to the chamber, and
   adjusting the first RF power to a second RF power.

Clause 20. The method of any of Clauses 1 to 19, wherein the first RF power and the second RF power are independently about 1 kW to about 6 kW.

Clause 21. The method of any of Clauses 1 to 20, wherein the seasoning film has a thickness of about 100 nm to about 700 nm and the deposition film has a thickness of about 500 nm to about 3 microns.

Clause 22. The method of any of Clauses 1 to 21, wherein the component of the process chamber is not a wafer.

Clause 23. The method of any of Clauses 1 to 22, wherein the component of the process chamber is a wall of the process chamber.

Clause 24. The method of any of Clauses 1 to 23, further comprising introducing a nitrogen-containing gas to the seasoning film to form a nitrogen-treated seasoning film, wherein introducing the nitrogen-containing gas to the seasoning film is performed before depositing the deposition film onto the seasoning film.

Clause 25. The method of any of Clauses 1 to 24, wherein introducing the nitrogen-containing gas to the seasoning film is performed at a chamber pressure of about 4 mTorr to about 20 mTorr and a temperature below about 200° C.

Clause 26. The method of any of Clauses 1 to 25, wherein the nitrogen-containing gas comprises ammonia.

Clause 27. The method of any of Clauses 1 to 26, wherein introducing the nitrogen-containing gas to the seasoning film comprises flowing the nitrogen-containing gas into the process chamber at a flow rate of about 25 sccm to about 1,000 sccm.

Clause 28. The method of any of Clauses 1 to 27, wherein introducing the nitrogen-containing gas to the seasoning film comprises providing an RF power of about 100 kW to about 4,000 kW to the process chamber.

Clause 29. The method of any of Clauses 1 to 28, wherein the nitrogen gas comprises ammonia.

Clause 30. The method of any of Clauses 1 to 29, further comprising introducing a nitrogen-containing gas to the seasoning film to form a nitrogen-treated seasoning film, wherein introducing the nitrogen-containing gas to the seasoning film is performed before depositing the deposition film onto the seasoning film.

Clause 31. The method of any of Clauses 1 to 30, wherein introducing the nitrogen-containing gas to the seasoning film is performed at a chamber pressure of about 4 mTorr to about 20 mTorr and a temperature below about 200° C.

Clause 32. The method of any of Clauses 1 to 31, wherein the nitrogen-containing gas comprises ammonia.

Clause 33. The method of any of Clauses 1 to 32, wherein introducing the nitrogen-containing gas to the seasoning film comprises flowing the nitrogen-containing gas into the process chamber at a flow rate of about 25 sccm to about 1,000 sccm.

Clause 34. The method of any of Clauses 1 to 33, wherein introducing the nitrogen-containing gas to the seasoning film comprises providing an RF power of about 100 kW to about 4,000 kW to the process chamber.

Clause 35. The method of any of Clauses 1 to 34, wherein the nitrogen gas comprises ammonia.

Clause 36. A method for seasoning a process chamber, comprising:
   depositing a first seasoning film onto a component of the process chamber at a chamber pressure of about 4 mTorr to about 20 mTorr and a temperature below about 200° C. or about 200° C. to about 400° C.;
   depositing a second seasoning film onto the first seasoning film; and
   depositing a deposition film onto the second seasoning film,
   wherein depositing the first seasoning film comprises flowing a first carbon-containing precursor gas and a first inert precursor gas into the process chamber.

Clause 37. The method of Clause 36, wherein the temperature is about 100° C. to about 200° C.

Clause 38. The method of Clauses 36 or 37, wherein the temperature is about 250° C. to about 300° C.

Clause 39. The method of any of Clauses 36 to 38, wherein depositing the second seasoning film onto the first seasoning film is performed at a chamber pressure of about 4 mTorr to about 20 mTorr and a temperature below about 200° C.

Clause 40. The method of any of Clauses 36 to 39, wherein:
   depositing the second seasoning film comprises flowing a second carbon-containing precursor gas and a second inert precursor gas into the process chamber; and
   depositing the deposition film comprises flowing a third carbon-containing precursor gas and a third inert precursor gas into the process chamber,
   wherein:
   the second carbon-containing precursor gas is the same as or different than the first or third carbon-containing precursor gas and the second inert precursor gas is the same as or different than the first or third inert precursor gas, and
   the third carbon-containing precursor gas is the same as or different than the first or second carbon-containing precursor gas and the third inert precursor gas is the same as or different than the first or second inert precursor gas.

Clause 41. The method of any of Clauses 36 to 40, wherein:
   depositing the first seasoning film onto the component comprises flowing the first carbon-containing precursor gas and the first inert precursor gas at a first flow ratio of the first carbon-containing precursor gas and the first inert precursor gas; and
   depositing the second seasoning film onto the first seasoning film comprises adjusting the first flow ratio of the first carbon-containing precursor gas and the first inert precursor gas to a second flow ratio.

Clause 42. The method of any of Clauses 36 to 41, wherein the first flow ratio is about 1:1 to about 1:2.

Clause 43. The method of any of Clauses 36 to 42, wherein the second flow ratio is about 10:1 to about 1:1 or about 1:2 to about 1:10.

Clause 44. The method of any of Clauses 36 to 43, wherein adjusting the first flow ratio to the second flow ratio is performed at a rate of about 1 second or less.

Clause 45. The method of any of Clauses 36 to 44, wherein:
depositing the first seasoning film onto the component comprises providing a first RF power to the chamber; and
depositing the second seasoning film onto the first seasoning film comprises adjusting the first RF power to a second RF power.

Clause 46. The method of any of Clauses 36 to 45, wherein adjusting the first RF power to the second RF power is performed at a rate of about 1 second or less.

Clause 47. The method of any of Clauses 36 to 46, wherein depositing the deposition film onto the second seasoning film is performed at a chamber pressure of about 4 mTorr to about 20 mTorr and a temperature below about 200° C.

Clause 48. The method of any of Clauses 36 to 47, wherein depositing the deposition film onto the second seasoning film is performed by flowing a third carbon-containing precursor gas into the process chamber at a flow rate of about 200 sccm to about 400 sccm.

Clause 49. The method of any of Clauses 36 to 48, wherein depositing the deposition film onto the second seasoning film comprises providing an RF power of about 1 kW to about 6 kW to the process chamber.

Clause 50. The method of any of Clauses 36 to 49, wherein the first carbon-containing precursor gas, the second carbon-containing precursor gas, and the third carbon-containing precursor gas comprise acetylene.

Clause 51. The method of any of Clauses 36 to 50, wherein the first inert precursor gas, the second inert precursor gas, and the third inert precursor gas comprise helium.

Clause 52. The method of any of Clauses 36 to 51, wherein flowing the first carbon-containing precursor gas and the first inert precursor gas into the process chamber comprises:
flowing the first carbon-containing precursor gas into the process chamber at a flow rate of about 100 sccm to about 600 sccm, and
flowing the first inert precursor gas into the process chamber at a flow rate of about 150 sccm to about 800 sccm.

Clause 53. The method of any of Clauses 36 to 52, wherein flowing the second carbon-containing precursor gas and the second inert precursor gas into the process chamber comprises:
flowing the second carbon-containing precursor gas into the process chamber at a flow rate of about 100 sccm to about 600 sccm, wherein the flow rate of the second carbon-containing precursor gas is different than the flow rate of the first carbon-containing precursor gas, and
flowing the second inert precursor gas into the process chamber at a flow rate of about 150 sccm to about 800 sccm, wherein the flow rate of the second inert precursor gas is different than the flow rate of the first inert precursor gas.

Clause 54. The method of any of Clauses 36 to 53, wherein:
depositing the first seasoning film onto the component comprises providing a first RF power to the chamber, and
depositing the second seasoning film onto the first seasoning film comprises providing a second RF power to the chamber, wherein the second RF power is different than the first RF power.

Clause 55. The method of any of Clauses 36 to 54, wherein the first RF power and the second RF power are independently about 1 kW to about 6 kW.

Clause 56. The method of any of Clauses 36 to 55, wherein the first RF power is from about 1 kW to about 3 kW and the second RF power is from about 3 kW to about 6 kW.

Clause 57. The method of any of Clauses 36 to 56, wherein the first seasoning film and the second seasoning film have a combined thickness of about 100 nm to about 700 nm and the deposition film has a thickness of about 500 nm to about 3 microns.

Clause 58. The method of any of Clauses 36 to 57, wherein the component of the process chamber is not a wafer.

Clause 59. The method of any of Clauses 36 to 58, wherein the component of the process chamber is a wall of the process chamber.

Clause 60. The method of any of Clauses 36 to 59, further comprising introducing a nitrogen-containing gas to the second seasoning film to form a nitrogen-treated seasoning film, wherein introducing the nitrogen-containing gas to the second seasoning film is performed before depositing the deposition film onto the second seasoning film.

Clause 61. The method of any of Clauses 36 to 60, wherein introducing the nitrogen-containing gas to the second seasoning film is performed at a chamber pressure of about 4 mTorr to about 20 mTorr and a temperature below about 200° C.

Clause 62. The method of any of Clauses 36 to 61, wherein the nitrogen-containing gas comprises ammonia.

Clause 63. The method of any of Clauses 36 to 62, wherein introducing the nitrogen-containing gas to the second seasoning film comprises flowing the nitrogen-containing gas into the process chamber at a flow rate of about 25 sccm to about 1,000 sccm.

Clause 64. The method of any of Clauses 36 to 63, wherein introducing the nitrogen-containing gas to the second seasoning film comprises providing an RF power of about 100 kW to about 4,000 kW to the process chamber.

Clause 65. The method of any of Clauses 36 to 64, wherein the nitrogen gas comprises ammonia.

Clause 66. A method for seasoning a process chamber, comprising:
depositing a first seasoning film onto a component of the process chamber at a chamber pressure of about 4 mTorr to about 20 mTorr and a temperature below about 200° C. or about 200° C. to about 400° C.;
depositing a plurality of additional seasoning films onto the first seasoning film; and
depositing a deposition film onto the plurality of additional seasoning films,
wherein:
depositing the first seasoning film comprises flowing a first carbon-containing precursor gas and a first inert precursor gas into the process chamber.

Clause 67. The method of Clause 66, wherein the temperature is from about 100° C. to about 200° C.

Clause 68. The method of Clauses 66 or 67, wherein the temperature is about 250° C. to about 300° C.

Clause 69. The method of any of Clauses 66 to 68, wherein depositing the plurality of additional seasoning films comprises:
- depositing a second seasoning film onto the first seasoning film by flowing a second carbon-containing precursor gas and a second inert precursor gas into the process chamber,
- depositing a third seasoning film onto the second seasoning film by flowing a third carbon-containing precursor gas and a third inert precursor gas into the process chamber,
- depositing a fourth seasoning film onto the third seasoning film by flowing a fourth carbon-containing precursor gas and a fourth inert precursor gas into the process chamber, wherein:
- the second, third, and fourth carbon-containing precursor gases are independently the same as or different than each other, and
- the second, third, and fourth inert precursor gases are independently the same as or different than each other.

Clause 70. The method of any of Clauses 66 to 69, wherein depositing the plurality of additional seasoning films comprises:
- depositing a fifth seasoning film onto the fourth seasoning film by flowing a fifth carbon-containing precursor gas and a fifth inert precursor gas into the process chamber,
- depositing a sixth seasoning film onto the fifth seasoning film by flowing a sixth carbon-containing precursor gas and a sixth inert precursor gas into the process chamber,
- depositing a seventh seasoning film onto the sixth seasoning film by flowing a seventh carbon-containing precursor gas and a seventh inert precursor gas into the process chamber, and
- depositing an eighth seasoning film onto the seventh seasoning film by flowing an eighth carbon-containing precursor gas and an eighth inert precursor gas into the process chamber, wherein:
- the fifth, sixth, seventh, and eighth carbon-containing precursor gases are independently the same as or different than each other, and
- the fifth, sixth, seventh, and eighth inert precursor gases are independently the same as or different than each other.

Clause 71. The method of any of Clauses 66 to 70, wherein each seasoning film of the plurality of additional seasoning films has a different intrinsic stress than an adjacent seasoning film of the plurality of additional seasoning films.

Clause 72. The method of any of Clauses 66 to 71, wherein depositing one or more seasoning film of the plurality of additional seasoning films is performed at a chamber pressure of about 4 mTorr to about 20 mTorr and a temperature below about 200° C.

Clause 73. The method of any of Clauses 66 to 72, wherein depositing each seasoning film of the plurality of additional seasoning films is performed at a chamber pressure of about 4 mTorr to about 20 mTorr and a temperature below about 200° C.

Clause 74. The method of any of Clauses 66 to 73, wherein:
- depositing the first seasoning film onto the component comprises flowing the first carbon-containing precursor gas and the first inert precursor gas at a first flow ratio of the first carbon-containing precursor gas and the first inert precursor gas;
- depositing the second seasoning film onto the first seasoning film comprises adjusting the first flow ratio of the first carbon-containing precursor gas and the first inert precursor gas to a second flow ratio;
- depositing the third seasoning film onto the second seasoning film comprises adjusting the second flow ratio of the second carbon-containing precursor gas and the second inert precursor gas to a third flow ratio; and
- depositing the fourth seasoning film onto the third seasoning film comprises adjusting the third flow ratio of the third carbon-containing precursor gas and the third inert precursor gas to a fourth flow ratio.

Clause 75. The method of any of Clauses 66 to 74, wherein the first flow ratio and the third flow ratio are independently about 1:1 to about 1:2.

Clause 76. The method of any of Clauses 66 to 75, wherein the second flow ratio and the fourth flow ratio are about 10:1 to about 1:1 or about 1:2 to about 1:10.

Clause 77. The method of any of Clauses 66 to 76, wherein adjusting the first flow ratio to the second flow ratio, the second flow ratio to the third flow ratio, and the third flow ratio to the fourth flow ratio are performed at a rate of independently about 1 second or less.

Clause 78. The method of any of Clauses 66 to 77, wherein:
- depositing the fifth seasoning film onto the fourth seasoning film comprises flowing the fifth carbon-containing precursor gas and the fifth inert precursor gas at a fifth flow ratio of the fifth carbon-containing precursor gas and the fifth inert precursor gas;
- depositing the sixth seasoning film onto the fifth seasoning film comprises adjusting the fifth flow ratio of the fifth carbon-containing precursor gas and the fifth inert precursor gas to a sixth flow ratio;
- depositing the seventh seasoning film onto the sixth seasoning film comprises adjusting the sixth flow ratio of the sixth carbon-containing precursor gas and the sixth inert precursor gas to a seventh flow ratio; and
- depositing the eighth seasoning film onto the seventh seasoning film comprises adjusting the seventh flow ratio of the seventh carbon-containing precursor gas and the seventh inert precursor gas to an eighth flow ratio.

Clause 79. The method of any of Clauses 66 to 78, wherein the fifth flow ratio and the seventh flow ratio are independently about 1:1 to about 1:2.

Clause 80. The method of any of Clauses 66 to 79, wherein the sixth flow ratio and the eighth flow ratio are about 10:1 to about 1:1 or about 1:2 to about 1:10.

Clause 81. The method of any of Clauses 66 to 80, wherein adjusting the first flow ratio to the second flow ratio, the second flow ratio to the third flow ratio, the third flow ratio to the fourth flow ratio, the fourth flow ratio to the fifth flow ratio, the fifth flow ratio to the sixth flow ratio, the sixth flow ratio to the seventh flow ratio, and the seventh flow ratio to the eight flow ratio are performed at a rate of independently about 1 second or less.

Clause 82. The method of any of Clauses 66 to 81, wherein:
- depositing the first seasoning film onto the component comprises providing a first RF power to the chamber;
- depositing the second seasoning film onto the first seasoning film comprises adjusting the first RF power to a second RF power;
- depositing the third seasoning film onto the second seasoning film comprises adjusting the second RF power to a third RF power; and
- depositing the fourth seasoning film onto the third seasoning film comprises adjusting the third RF power to a fourth RF power.

Clause 83. The method of any of Clauses 66 to 82, wherein adjusting the first RF power to the second RF power, the second RF power to the third RF power, and the third RF power to the fourth RF power is performed at a rate of independently about 1 second or less.

Clause 84. The method of any of Clauses 66 to 83, wherein the first RF power, the second RF power, the third RF power, and the fourth RF power are independently about 1 kW to about 6 kW.

Clause 85. The method of any of Clauses 66 to 84, wherein:
the first RF power and third RF power are from independently about 1 kW to about 3 kW, and
the second RF power and the fourth RF power are from independently about 3 kW to about 6 kW.

Clause 86. The method of any of Clauses 66 to 85, wherein:
depositing the fifth seasoning film onto the fourth seasoning film comprises adjusting the fourth RF power to a fifth RF power;
depositing the sixth seasoning film onto the fifth seasoning film comprises adjusting the fifth RF power to a sixth RF power;
depositing the seventh seasoning film onto the sixth seasoning film comprises adjusting the sixth RF power to a seventh RF power; and
depositing the eighth seasoning film onto the seventh seasoning film comprises adjusting the seventh RF power to an eighth RF power.

Clause 87. The method of any of Clauses 66 to 86, wherein adjusting the first RF power to the second RF power, the second RF power to the third RF power, the third RF power to the fourth RF power, the fourth RF power to the fifth RF power, the fifth RF power to the sixth RF power, the sixth RF power to the seventh RF power, and the seventh RF power to the eighth RF power is performed at a rate of independently about 1 second or less.

Clause 88. The method of any of Clauses 66 to 87, wherein the first RF power, the second RF power, the third RF power, the fourth RF power, the fifth RF power, the sixth RF power, the seventh RF power, and the eighth RF power are independently about 1 kW to about 6 kW.

Clause 89. The method of any of Clauses 66 to 88, wherein:
the first RF power, the third RF power, the fifth RF power, and the seventh RF power are from independently about 1 kW to about 3 kW, and
the second RF power, the fourth RF power, the sixth RF power, and the eighth RF power are from independently about 3 kW to about 6 kW.

Clause 90. The method of any of Clauses 66 to 89, wherein the first carbon-containing precursor gas, the second carbon-containing precursor gas, the third carbon-containing precursor gas, and the fourth carbon-containing precursor gas comprise acetylene.

Clause 91. The method of any of Clauses 66 to 90, wherein the first carbon-containing precursor gas, the second carbon-containing precursor gas, the third carbon-containing precursor gas, the fourth carbon-containing precursor gas, the fifth carbon-containing precursor gas, the sixth carbon-containing precursor gas, the seventh carbon-containing precursor gas, and the eighth carbon-containing precursor gas comprise acetylene.

Clause 92. The method of any of Clauses 66 to 91, wherein the first inert precursor gas, the second inert precursor gas, the third inert precursor gas, and the fourth inert precursor gas comprise helium.

Clause 93. The method of any of Clauses 66 to 92, wherein the first inert precursor gas, the second inert precursor gas, the third inert precursor gas, the fourth inert precursor gas, the fifth inert precursor gas, the sixth inert precursor gas, the seventh inert precursor gas, and the eighth inert precursor gas comprise helium.

Clause 94. The method of any of Clauses 66 to 93, wherein flowing the first carbon-containing precursor gas and the first inert precursor gas into the process chamber comprises:
flowing the first carbon-containing precursor gas into the process chamber at a flow rate of about 100 sccm to about 600 sccm, and
flowing the first inert precursor gas into the process chamber at a flow rate of about 150 sccm to about 800 sccm.

Clause 95. The method of any of Clauses 66 to 94, wherein:
flowing the first inert precursor gas, the second carbon-containing precursor gas, the third carbon-containing precursor gas, and the fourth carbon-containing precursor gas into the process chamber are performed at a flow rate of independently about 100 sccm to about 600 sccm, and
flowing the first inert precursor gas, the second inert precursor gas, the third inert precursor gas, and the fourth inert precursor gas into the process chamber are performed at a flow rate of independently about 150 sccm to about 800 sccm.

Clause 96. The method of any of Clauses 66 to 95, wherein:
flowing the first inert precursor gas, the second carbon-containing precursor gas, the third carbon-containing precursor gas, the fourth carbon-containing precursor gas, the fifth carbon-containing precursor gas, the sixth carbon-containing precursor gas, the seventh carbon-containing precursor gas, and the eighth carbon-containing precursor gas into the process chamber are performed at a flow rate of independently about 100 sccm to about 600 sccm, and
flowing the first inert precursor gas, the second inert precursor gas, the third inert precursor gas, the fourth inert precursor gas, the fifth inert precursor gas, the sixth inert precursor gas, the seventh inert precursor gas, and the eighth inert precursor gas into the process chamber are performed at a flow rate of independently about 150 sccm to about 800 sccm.

Clause 97. The method of any of Clauses 66 to 96, wherein the first seasoning film and the plurality of additional seasoning films have a combined thickness of about 100 nm to about 700 nm and the deposition film has a thickness of about 500 nm to about 3 microns.

Clause 98. The method of any of Clauses 66 to 97, wherein depositing the deposition film onto the plurality of additional seasoning films is performed at a chamber pressure of about 4 mTorr to about 20 mTorr and a temperature below about 200° C.

Clause 99. The method of any of Clauses 66 to 98, wherein depositing the deposition film onto the plurality of additional seasoning films is performed by flowing a third carbon-containing precursor gas into the process chamber at a flow rate of about 200 sccm to about 400 sccm.

Clause 100. The method of any of Clauses 66 to 99, wherein depositing the deposition film onto the plurality of additional seasoning films comprises providing an RF power of about 1 kW to about 6 kW to the process chamber.

Clause 101. The method of any of Clauses 66 to 100, wherein the component of the process chamber is not a wafer.

Clause 102. The method of any of Clauses 66 to 101, wherein the component of the process chamber is a wall of the process chamber.

Clause 103. The method of any of Clauses 66 to 102, further comprising introducing a nitrogen-containing gas to a film of the plurality of additional seasoning films to form a nitrogen-treated seasoning film, wherein introducing the nitrogen-containing gas to the film of the plurality of additional seasoning films is performed before depositing the deposition film onto the plurality of additional seasoning films.

Clause 104. The method of any of Clauses 66 to 103, wherein introducing the nitrogen-containing gas to the plurality of additional seasoning films is performed at a chamber pressure of about 4 mTorr to about 20 mTorr and a temperature below about 200° C.

Clause 105. The method of any of Clauses 66 to 104, wherein the nitrogen-containing gas comprises ammonia.

Clause 106. The method of any of Clauses 66 to 105, wherein introducing the nitrogen-containing gas to the plurality of additional seasoning films comprises flowing the nitrogen-containing gas into the process chamber at a flow rate of about 25 sccm to about 1,000 sccm.

Clause 107. The method of any of Clauses 66 to 106, wherein introducing the nitrogen-containing gas to the plurality of additional seasoning films comprises providing an RF power of about 100 kW to about 4,000 kW to the process chamber.

Clause 108. The method of any of Clauses 66 to 107, wherein the nitrogen gas comprises ammonia.

Overall, methods of the present disclosure can provide reduced flaking of protective materials (a deposition film) and improved adhesion of the deposition film to a chamber component by providing a seasoning film disposed between the deposition film and the chamber component. For example, a deposition film can have an intrinsic stress of about 300 MPa or less (compressive) whereas a chamber component (e.g., an aluminum-containing component) can have an intrinsic stress of about 800 MPa or greater (compressive). Such a mismatch of intrinsic stress of the deposition film and the chamber component promotes flaking and inferior adhesion of the deposition film and the chamber component. However, the inventors have discovered that by controlling the intrinsic stress of a seasoning film, a seasoning film can be tailored to beneficially adhere to the deposition film on one side of the seasoning film and adhere to the chamber component on an opposite side of the seasoning film. The inventors have discovered a number of approaches to accomplish such improvements.

While the foregoing is directed to embodiments of the present disclosure, other and further embodiments of the disclosure may be devised without departing from the basic scope thereof, and the scope thereof is determined by the claims that follow.

What is claimed is:

1. A method for seasoning a process chamber, comprising:
depositing a first seasoning film onto a component of the process chamber at a chamber pressure of about 4 mTorr to about 20 mTorr and a temperature below about 200° C. or about 200° C. to about 400° C.;
depositing a second seasoning film onto the first seasoning film; and
depositing a deposition film onto the second seasoning film,
wherein depositing the first seasoning film comprises flowing a first carbon-containing precursor gas and a first inert precursor gas into the process chamber,
wherein the first seasoning film comprises a first intrinsic stress having a first value and the second seasoning film comprises a second intrinsic stress having a second value that is less than the first value.

2. The method of claim 1, wherein:
depositing the first seasoning film onto the component comprises flowing the first carbon-containing precursor gas and the first inert precursor gas at a first flow ratio of the first carbon-containing precursor gas and the first inert precursor gas, and
depositing the second seasoning film onto the first seasoning film comprises adjusting the first flow ratio of the first carbon-containing precursor gas and the first inert precursor gas to a second flow ratio.

3. The method of claim 1, wherein:
depositing the first seasoning film onto the component comprises providing a first RF power to the chamber, and
depositing the second seasoning film onto the first seasoning film comprises adjusting the first RF power to a second RF power.

4. A method for seasoning a process chamber, comprising:
depositing a first seasoning film onto a component of the process chamber at a chamber pressure of about 4 mTorr to about 20 mTorr and a temperature below about 200° C. or about 200° C. to about 400° C.;
depositing a plurality of additional seasoning films onto the first seasoning film, wherein each seasoning film of the plurality of additional seasoning films comprises an alternating intrinsic stress such that each additional seasoning film alternates between a higher intrinsic stress and a lower intrinsic stress; and
depositing a deposition film onto the plurality of additional seasoning films,
wherein:
depositing the first seasoning film comprises flowing a first carbon-containing precursor gas and a first inert precursor gas into the process chamber.

5. The method of claim 4, wherein depositing the plurality of additional seasoning films comprises:
depositing a second seasoning film onto the first seasoning film by flowing a second carbon-containing precursor gas and a second inert precursor gas into the process chamber,
depositing a third seasoning film onto the second seasoning film by flowing a third carbon-containing precursor gas and a third inert precursor gas into the process chamber,
depositing a fourth seasoning film onto the third seasoning film by flowing a fourth carbon-containing precursor gas and a fourth inert precursor gas into the process chamber,
wherein:
the second, third, and fourth carbon-containing precursor gases are independently the same as or different than each other, and
the second, third, and fourth inert precursor gases are independently the same as or different than each other.

6. The method of claim 5, wherein:
depositing the first seasoning film onto the component comprises flowing the first carbon-containing precursor gas and the first inert precursor gas at a first flow ratio of the first carbon-containing precursor gas and the first inert precursor gas;
depositing the second seasoning film onto the first seasoning film comprises adjusting the first flow ratio of the first carbon-containing precursor gas and the first inert precursor gas to a second flow ratio;

depositing the third seasoning film onto the second seasoning film comprises adjusting the second flow ratio of the second carbon-containing precursor gas and the second inert precursor gas to a third flow ratio; and depositing the fourth seasoning film onto the third seasoning film comprises adjusting the third flow ratio of the third carbon-containing precursor gas and the third inert precursor gas to a fourth flow ratio.

7. The method of claim 6, wherein the first flow ratio and the third flow ratio are independently about 1:1 to about 1:2.

8. The method of claim 5, wherein:

depositing the first seasoning film onto the component comprises providing a first RF power to the chamber;

depositing the second seasoning film onto the first seasoning film comprises adjusting the first RF power to a second RF power;

depositing the third seasoning film onto the second seasoning film comprises adjusting the second RF power to a third RF power; and depositing the fourth seasoning film onto the third seasoning film comprises adjusting the third RF power to a fourth RF power.

9. The method of claim 5, wherein the first seasoning film comprises a first intrinsic stress value;

the second seasoning film comprises a second intrinsic stress value that is different than the first intrinsic stress value;

the third seasoning film comprises a third intrinsic stress value that is the same as the first intrinsic stress value;

the fourth seasoning film comprises a fourth intrinsic stress that is the same as the second intrinsic stress value.

* * * * *